(12) United States Patent
Yamazaki et al.

(10) Patent No.: US 8,329,520 B2
(45) Date of Patent: Dec. 11, 2012

(54) METHOD FOR MANUFACTURING SEMICONDUCTOR DEVICE USING A LASER ANNEALING PROCESS

(75) Inventors: Shunpei Yamazaki, Tokyo (JP);
Akiharu Miyanaga, Kanagawa (JP);
Masahiro Takahashi, Kanagawa (JP);
Takuya Hirohashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 271 days.

(21) Appl. No.: 12/750,739

(22) Filed: Mar. 31, 2010

(65) Prior Publication Data

US 2010/0255645 A1    Oct. 7, 2010

(30) Foreign Application Priority Data

Apr. 2, 2009   (JP) ................. 2009-090471

(51) Int. Cl.
*H01L 21/84* (2006.01)
(52) U.S. Cl. ........ 438/154; 438/478; 438/486; 438/487; 257/627; 257/E21.134; 257/E29.137
(58) Field of Classification Search .............. 438/478, 438/486–487, 166, 154; 257/627, E21.134, 257/E29.137, E23.001
See application file for complete search history.

(56) References Cited

U.S. PATENT DOCUMENTS

| | | | |
|---|---|---|---|
| 5,976,959 A | 11/1999 | Huang | |
| 6,372,609 B1 | 4/2002 | Aga et al. | |
| 6,602,758 B2 | 8/2003 | Kizilyalli et al. | |
| 7,192,844 B2 | 3/2007 | Couillard et al. | |
| 7,411,274 B2 | 8/2008 | Yamanaka et al. | |
| 7,898,033 B2 | 3/2011 | Ohmi et al. | |
| 2007/0281172 A1 | 12/2007 | Couillard et al. | |
| 2008/0093601 A1* | 4/2008 | Kang et al. | 257/66 |
| 2008/0213984 A1* | 9/2008 | Moriwaka | 438/487 |
| 2009/0042362 A1 | 2/2009 | Moriwaka | |

FOREIGN PATENT DOCUMENTS

| | | |
|---|---|---|
| JP | 11-150046 | 6/1999 |
| JP | 2000-124092 | 4/2000 |
| JP | 2004-265918 A | 9/2004 |
| JP | 2006-229047 | 8/2006 |
| JP | 2007-027677 A | 2/2007 |

* cited by examiner

*Primary Examiner* — Evan Pert
*Assistant Examiner* — Mark A Laurenzi
(74) *Attorney, Agent, or Firm* — Eric J. Robinson; Robinson Intellectual Property Law Office, P.C.

(57) ABSTRACT

An island-shaped single crystal semiconductor layer whose top surface has a plane within ±10° from a {211} plane is formed on an insulating surface; a non-single-crystal semiconductor layer is formed in contact with the top surface and a side surface of the single crystal semiconductor layer and on the insulating surface; the non-single-crystal semiconductor layer is irradiated with laser light to melt the non-single-crystal semiconductor layer, and to crystallize the non-single-crystal semiconductor layer formed on the insulating surface with use of the single crystal semiconductor layer as a seed crystal, so that a crystalline semiconductor layer is formed. A semiconductor device having an n-channel transistor and a p-channel transistor formed with use of the crystalline semiconductor layer is provided.

12 Claims, 17 Drawing Sheets

104  106

110  106

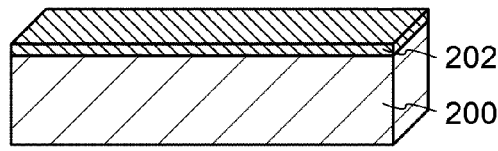
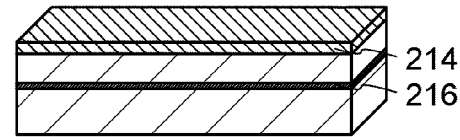
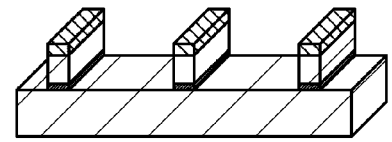
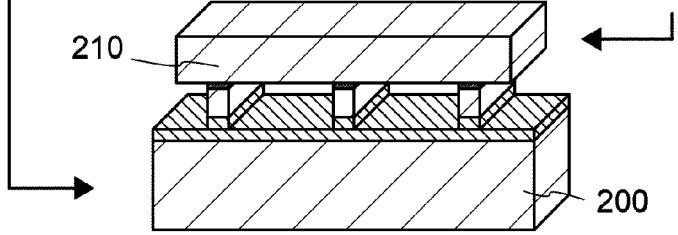
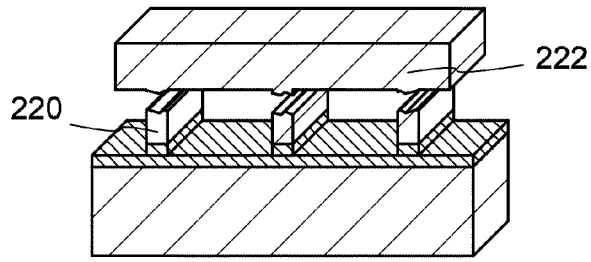
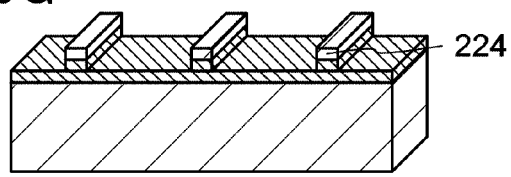

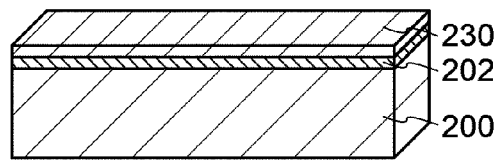
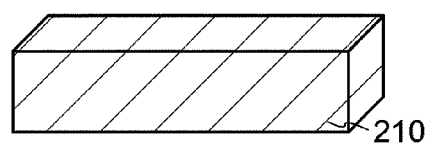
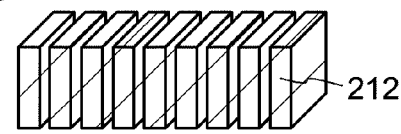
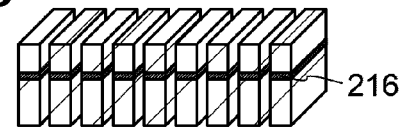
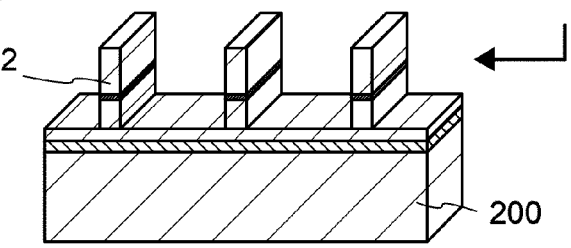
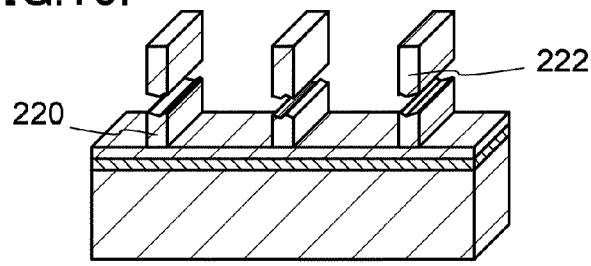
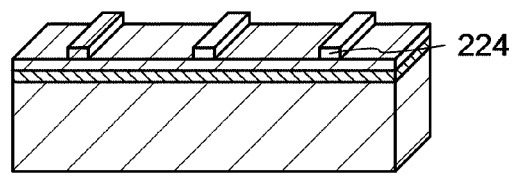

METHOD FOR MANUFACTURING SEMICONDUCTOR DEVICE USING A LASER ANNEALING PROCESS

BACKGROUND OF THE INVENTION

1. Field of the Invention

The present invention relates to a method for manufacturing a semiconductor device.

2. Description of the Related Art

An integrated circuit has been developed, which uses a semiconductor substrate called a silicon-on-insulator (hereinafter also referred to as an SOI) that has a thin single crystal semiconductor layer on an insulating surface, instead of a silicon wafer that is manufactured by thinly slicing an ingot of a single crystal semiconductor. The integrated circuit using an SOI substrate has attracted attention as an integrated circuit which reduces parasitic capacitance between a drain of a transistor and the substrate and improves the performance of a semiconductor integrated circuit.

As a method for manufacturing an SOI substrate, a hydrogen ion implantation separation method is known (for example, see Patent Document 1). The hydrogen ion implantation separation method is a method in which hydrogen ions are implanted into a silicon wafer to form an embrittled region at a predetermined depth from a surface of the silicon wafer, the silicon wafer is split at the embrittled region, and a thin silicon layer is bonded to another silicon wafer.

In a CMOS technique, an NMOS and a PMOS are mainly formed with use of a silicon wafer having a (100) plane orientation. This (100) plane has high electron mobility, and is a crystal plane suitable for an NMOS; however, a (110) plane has high hole mobility, so the (100) plane is not a crystal plane suitable for a PMOS as compared with the (110) plane. In contrast, the (110) plane is a crystal plane suitable for a PMOS, but has lower electron mobility than the (100) plane; therefore, the (110) plane is not a crystal plane suitable for an NMOS.

In view of the above, in order to utilize both electron mobility of an NMOS and hole mobility of a PMOS, a semiconductor device in which a PMOS formed on a silicon wafer that has a (110) plane and an NMOS formed on a silicon layer that has a (100) plane formed on the silicon wafer having a (110) plane are provided is known (for example, see Patent Document 2).

[Reference]
[Patent Document]
[Patent Document 1] Japanese Published Patent Application No. 2000-124092
[Patent Document 2] Japanese Published Patent Application No. 2006-229047

SUMMARY OF THE INVENTION

To bond two semiconductor substrates is not suitable for forming a large-sized semiconductor device because the size of the semiconductor device depends on the size of the semiconductor substrates. Further, two substrates having different plane orientations are needed, so cost reduction is difficult.

An object of one embodiment of the present invention is to provide a large-sized semiconductor device at low cost. An object of another embodiment of the present invention is to improve performance of a semiconductor device in which an n-channel transistor and a p-channel transistor are included.

One embodiment of the present invention is a method for manufacturing a semiconductor device, including the steps of forming an island-shaped single crystal semiconductor layer whose top surface has a plane within ±10° from a {211} plane (that is, a plane within the range of greater than or equal to a {211} plane−10° and less than or equal to the {211} plane+10°) on an insulating surface; forming a non-single-crystal semiconductor layer in contact with the top surface and a side surface of the single crystal semiconductor layer and on the insulating surface; irradiating the non-single-crystal semiconductor layer with laser light to melt the non-single-crystal semiconductor layer, and to crystallize the non-single-crystal semiconductor layer formed on the insulating surface with use of the single crystal semiconductor layer as a seed crystal, so that a crystalline semiconductor layer is formed; and forming an n-channel transistor and a p-channel transistor with use of the crystalline semiconductor layer.

Another embodiment of the present invention is a method for manufacturing a semiconductor device, including the steps of forming an island-shaped single crystal semiconductor layer whose top surface has a plane within ±10° from a {211} plane on an insulating surface; forming an insulating layer so as to cover the top surface and a side surface of the single crystal semiconductor layer and to be on the insulating surface; forming an opening in the insulating layer to expose the top surface of the single crystal semiconductor layer; forming a non-single-crystal semiconductor layer so as to cover the exposed top surface of the single crystal semiconductor layer and the insulating surface; irradiating the non-single-crystal semiconductor layer with laser light to melt the non-single-crystal semiconductor layer, and to crystallize the non-single-crystal semiconductor layer formed on the insulating surface with use of the single crystal semiconductor layer as a seed crystal, so that a crystalline semiconductor layer is formed; and forming an n-channel transistor and a p-channel transistor with use of the crystalline semiconductor layer.

In the above, the step of forming the island-shaped single crystal semiconductor layer whose top surface has the plane within ±10° from the {211} plane on the insulating surface desirably includes the steps of adding ions to a single crystal semiconductor substrate whose top surface has a plane within ±10° from a {211} plane to form an embrittled region; bonding the single crystal semiconductor substrate and a base substrate having the insulating surface; and splitting the single crystal semiconductor substrate along the embrittled region.

Another embodiment of the present invention is a method for manufacturing a semiconductor device, including the steps of forming a non-single-crystal semiconductor layer on an insulating surface; forming an island-shaped single crystal semiconductor layer whose top surface has a plane within ±10° from a {211} plane over the non-single-crystal semiconductor layer; irradiating the non-single-crystal semiconductor layer with laser light to melt the non-single-crystal semiconductor layer, and to crystallize the non-single-crystal semiconductor layer with use of the single crystal semiconductor layer as a seed crystal, so that a crystalline semiconductor layer is formed; and forming an n-channel transistor and a p-channel transistor with use of the crystalline semiconductor layer.

In the above, the step of forming the island-shaped single crystal semiconductor layer whose top surface has the plane within ±10° from the {211} plane over the non-single-crystal semiconductor layer desirably includes the steps of adding ions to a single crystal semiconductor substrate whose top surface has a plane within ±10° from a {211} plane to form an embrittled region; bonding the single crystal semiconductor substrate and a base substrate including the non-single-crystal semiconductor layer; and splitting the single crystal semiconductor substrate along the embrittled region.

In addition, in the above, it is desirable that the channel length direction of each of the n-channel transistor and the p-channel transistor be in a <111> direction. Further, a CMOS circuit may be formed with use of the n-channel transistor and the p-channel transistor. Furthermore, in the above, the channel length of the n-channel transistor and the channel length of the p-channel transistor are preferably substantially the same. Here, the term "substantially the same" refers to a range of ±20% from an average value of the channel length of the n-channel transistor and that of the p-channel transistor. Note that a single crystal silicon layer may be formed as the single crystal semiconductor layer.

Note that in this specification, the term "a plane within ±10° from a {211} plane" means that the angle between a <211> direction and a direction perpendicular to the objective plane is 10° or less.

Note that in this specification, the term "single crystal" means a crystal in which, when certain crystal axes are focused, the direction of the crystal axes is oriented in the same direction of the crystal axes in any portion of a sample and which has no crystal grain boundaries in the crystal. In this specification, the "single crystal" includes a crystal in which directions of crystal axes are uniform as described above and which has no grain boundary even when including a crystal defect or a dangling bond.

In addition, the structure of a transistor described in this specification can have various modes, without limitation to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced and the voltage endurance of the transistor can be enhanced (the reliability can be improved). Further, with the multi-gate structure, drain-source current does not fluctuate very much even if drain-source voltage fluctuates when the transistor operates in a saturation region, so that a flat slope of voltage-current characteristics can be obtained. By utilizing the flat slope of the voltage-current characteristics, an ideal current source circuit or an active load having an extremely large resistance value can be realized. Accordingly, a differential circuit or a current mirror circuit which has excellent properties can be provided.

As another example, a structure where gate electrodes are formed above and below a channel may be employed. By employing the structure where gate electrodes are formed above and below the channel, a channel region is increased; thus, a current value can be increased. Alternatively, by employing the structure where gate electrodes are formed above and below the channel, a depletion layer is easily formed; thus, a subthreshold swing (an S value) can be reduced. When the gate electrodes are formed above and below the channel, a structure where a plurality of transistors are connected in parallel is provided.

A structure where a gate electrode is formed above a channel region, a structure where a gate electrode is formed below a channel region, a staggered structure, an inverted staggered structure, a structure where a channel region is divided into a plurality of regions, or a structure where channel regions are connected in parallel or in series can be employed. Alternatively, a structure where a source electrode or a drain electrode overlaps with a channel region (or part of it) can be employed. By using the structure where the source electrode or the drain electrode overlaps with the channel region (or part of it), unstable operation due to electric charge accumulated in part of the channel region can be prevented. Alternatively, a structure where an LDD region is provided can be employed. By providing the LDD region, off-current can be reduced or the voltage endurance of the transistor can be enhanced (the reliability can be improved). Further, by providing the LDD region, drain-source current does not fluctuate very much even if drain-source voltage fluctuates when the transistor operates in the saturation region, so that a flat slope of voltage-current characteristics can be obtained.

In this specification, silicon oxynitride contains more oxygen than nitrogen, and in the case where measurement is conducted using Rutherford backscattering spectrometry (RBS) and hydrogen forward scattering (HFS), silicon oxynitride preferably contains oxygen, nitrogen, silicon, and hydrogen at concentrations ranging from 50 atomic % to 70 atomic %, 0.5 atomic % to 15 atomic %, 25 atomic % to 35 atomic %, and 0.1 atomic % to 10 atomic %, respectively. Further, silicon nitride oxide contains more nitrogen than oxygen, and in the case where measurement is conducted using RBS and HFS, silicon nitride oxide preferably contains oxygen, nitrogen, silicon, and hydrogen at concentrations ranging from 5 atomic % to 30 atomic %, 20 atomic % to 55 atomic %, 25 atomic % to 35 atomic %, and 10 atomic % to 30 atomic %, respectively. Note that percentages of nitrogen, oxygen, silicon, and hydrogen fall within the ranges given above, where the total number of atoms contained in the silicon oxynitride or the silicon nitride oxide is defined as 100 atomic %.

In this specification, the term "semiconductor device" means any device that can function by utilizing semiconductor characteristics; and a display device, a semiconductor circuit, and an electronic device are all included in the category of the semiconductor devices.

Furthermore, in this specification, the term "display device" includes a light-emitting device and a liquid crystal display device in its category. A light-emitting device includes a light-emitting element, and a liquid crystal display device includes a liquid crystal element. A light-emitting element includes, in its category, an element whose luminance is controlled by current or voltage, and specifically includes an inorganic electroluminescent (EL) element, an organic EL element, and the like.

According to one embodiment of the present invention, a large-sized semiconductor device can be provided at low cost by using a crystalline semiconductor layer which is formed with use of a single crystal semiconductor layer provided over a substrate as a seed crystal. Further, according to one embodiment of the present invention, performance of a semiconductor device can be improved by provision of a channel layer with use of a crystal plane which is suitable for both of an n-channel transistor and a p-channel transistor.

BRIEF DESCRIPTION OF THE DRAWINGS

FIGS. 9A to 9G are diagrams illustrating an example of a manufacturing method of a semiconductor substrate.

FIGS. 10A to 10G are diagrams illustrating an example of a manufacturing method of a semiconductor substrate.

DETAILED DESCRIPTION OF THE INVENTION

Figure 1A:
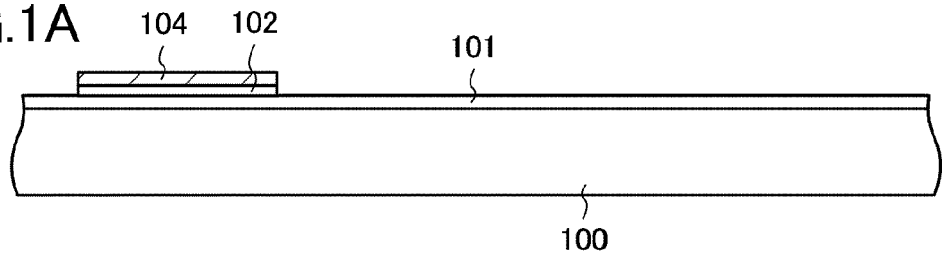
FIGS. 1A to 1E are diagrams illustrating an example of a manufacturing method of a semiconductor substrate.

Hereinafter, embodiments of the present invention will be described in detail with reference to the accompanying drawings. Note that the present invention is not limited to the following description of the embodiments, and it is easily understood by those skilled in the art that various changes may be made in modes and details without departing from the spirit and the scope of the present invention. Therefore, the present invention should not be construed as being limited to the description in the following embodiments. In addition, the structures in different embodiments can be implemented in combination as appropriate. Note that the same portions or portions having similar functions are denoted by the same reference numerals in the structure of the invention described below, and the description thereof is omitted.

Embodiment 1

In this embodiment, one example of a method for manufacturing a semiconductor substrate including a semiconductor layer on an insulating surface and a method for manufacturing a semiconductor device using the semiconductor substrate will be described with reference to drawings.
<Method for Manufacturing Semiconductor Substrate>

First, a method for manufacturing a semiconductor substrate will be described with reference to FIGS. 1A to 1E and FIGS. 2A and 2B. Note that FIGS. 1A to 1E are schematic cross-sectional views, and FIGS. 2A and 2B are schematic plan views.

First, a single crystal semiconductor layer is provided on an insulating surface. Here, a single crystal semiconductor layer 104 is provided over a substrate 100 including an insulating layer 101, with an insulating layer 102 provided therebetween (see FIG. 1A).

For the substrate 100, a substrate formed using an insulator, such as a glass substrate, a ceramic substrate, a quartz substrate, or a sapphire substrate, can be used. Alternatively, a substrate formed using a semiconductor such as silicon, a substrate formed using a conductor such as metal or stainless steel, or the like can be used. Further alternatively, for the substrate 100, a plastic substrate may be used as long as it can withstand the processing temperature in a manufacturing process in this embodiment.

The insulating layer 101 can be formed to have a single-layer structure of an insulating layer such as a silicon oxide film, a silicon oxynitride film, a silicon nitride film, or a silicon nitride oxide film, or a stacked-layer structure thereof. Note that the single crystal semiconductor layer 104 may be provided over the substrate 100 with the insulating layer 102 provided therebetween, without provision of the insulating layer 101.

The single crystal semiconductor layer 104 can be formed using an island-shaped single crystal semiconductor layer whose top surface has a plane within ±10° from a {211} plane. For the single crystal semiconductor layer 104, single crystal silicon can be used. Alternatively, a semiconductor formed using an element belonging to Group 14 of the periodic table, such as germanium, silicon germanium, or silicon carbide, can be used.

The top surface of the single crystal semiconductor layer 104 is on the side opposite to the side of a surface in contact with the insulating layer 102. The term "a plane within ±10° from a {211} plane" means that the angle between a <211> direction and a direction perpendicular to the objective plane is 10° or less.

Figure 1B:
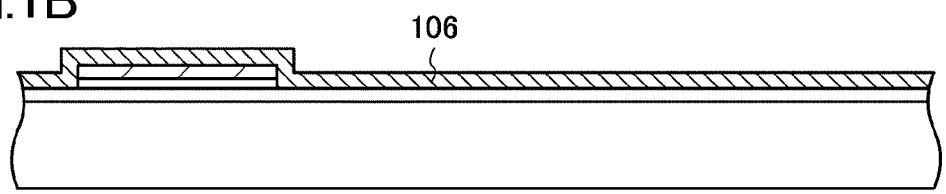
Figure 1C:
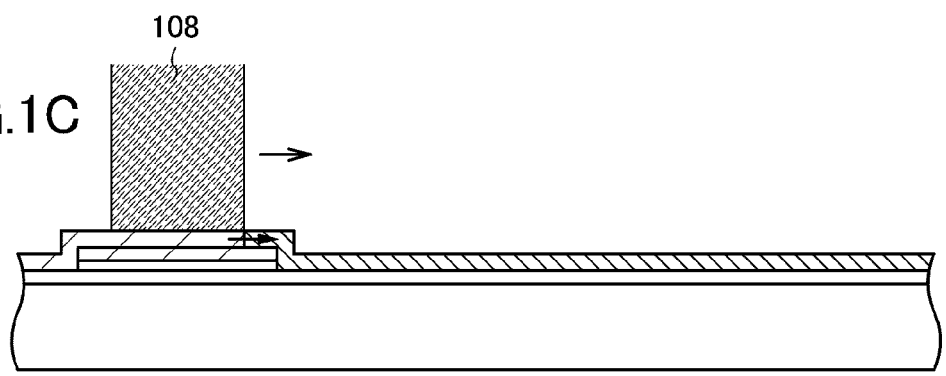
Figure 2A:
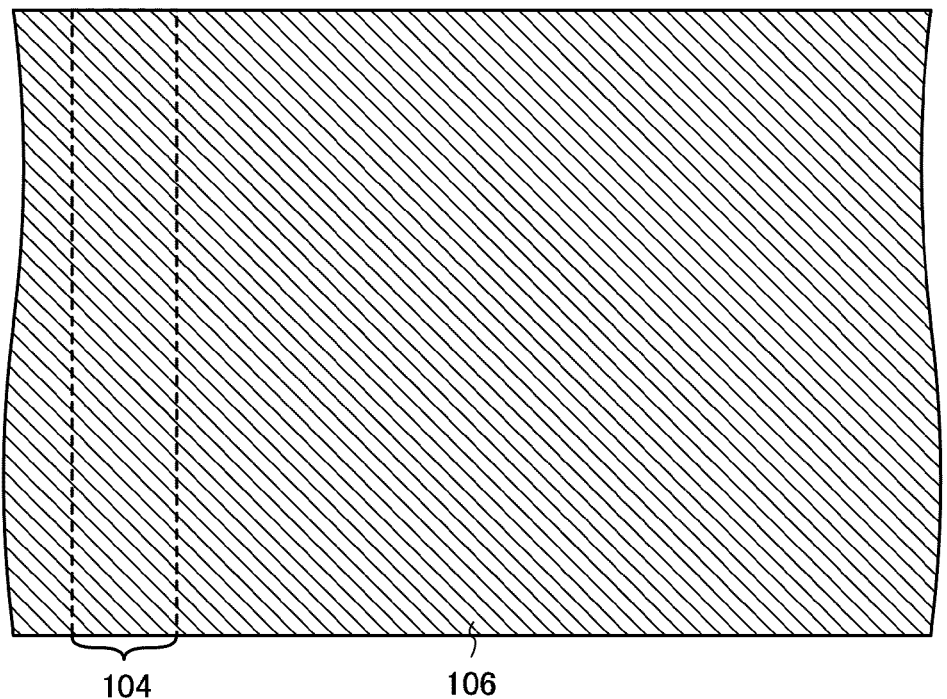
FIGS. 2A and 2B are diagrams illustrating an example of a manufacturing method of a semiconductor substrate.
Figure 2B:
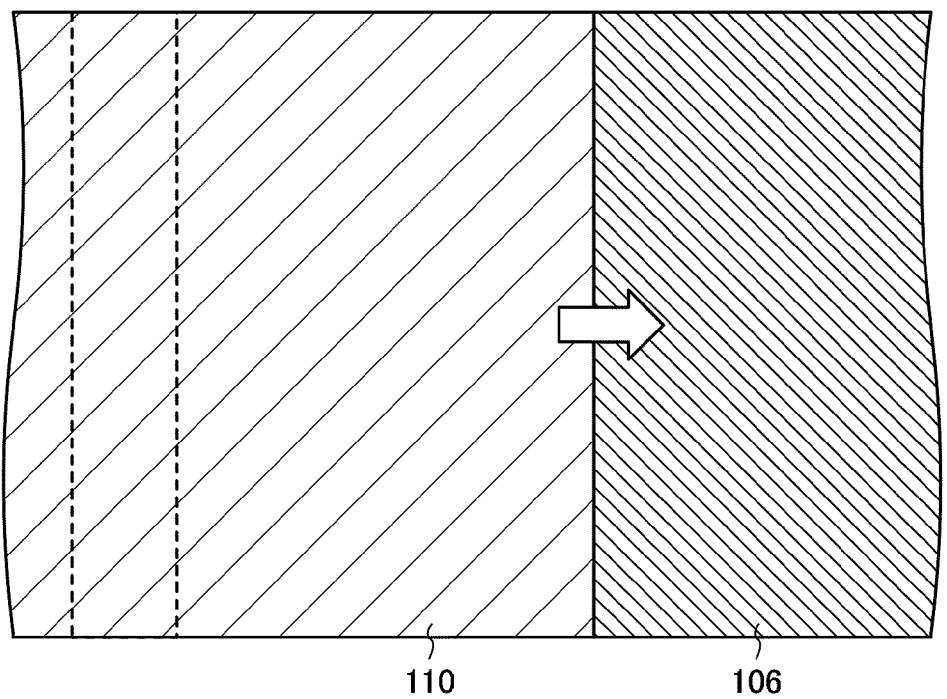

Next, a non-single-crystal semiconductor layer 106 is formed so as to cover the single crystal semiconductor layer 104 and the substrate 100 (see FIG. 1B and FIG. 2A). The non-single-crystal semiconductor layer 106 is formed in contact with the top surface and a side surface of the single crystal semiconductor layer 104 and on part of a surface of the substrate 100, which is not covered with the single crystal semiconductor layer 104.

The non-single-crystal semiconductor layer 106 can be formed using an amorphous semiconductor, a microcrystalline semiconductor, or a polycrystalline semiconductor. The non-single-crystal semiconductor layer 106 may be formed using a material similar to that of the single crystal semiconductor layer 104; for example, when the single crystal semiconductor layer 104 is formed using single crystal silicon, the non-single-crystal semiconductor layer 106 can be formed using amorphous silicon, microcrystalline silicon, or polycrystalline silicon.

Figure 1D:
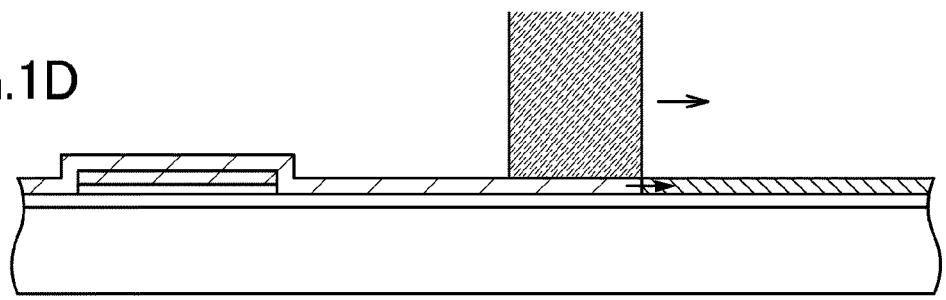

Next, the non-single-crystal semiconductor layer 106 is irradiated with laser light 108 so that the non-single-crystal semiconductor layer 106 is melted (see FIG. 1C), whereby the non-single-crystal semiconductor layer 106 formed over the substrate 100 is crystallized with use of the single crystal semiconductor layer 104 as a seed crystal (see FIG. 1D and FIG. 2B).

Specifically, part of the non-single-crystal semiconductor layer 106, which is in contact with the top surface of the single crystal semiconductor layer 104, is irradiated with the laser light 108, and then, scanning with the laser light 108 is performed; thus, the non-single-crystal semiconductor layer 106 formed over the substrate 100 is continuously melted to form a crystalline semiconductor layer over the substrate 100.

A laser used for irradiation with the laser light 108 is not particularly limited as long as it can melt the non-single-crystal semiconductor layer 106. For example, as the laser, a pulsed laser or a continuous wave laser (a CW laser) can be used. For example, a pulsed laser preferably has a repetition rate of less than 10 MHz and a pulse width of 10 ns to 500 ns. A typical pulsed laser is an excimer laser that emits laser light having a wavelength of 400 nm or less. As the aforementioned excimer laser, for example, an XeCl excimer laser having a repetition rate of 10 Hz to 300 Hz, a pulse width of 25 ns, and a wavelength of 308 nm can be used. In addition, in scanning with the pulsed laser light, one shot and the following shot may be partially overlapped with each other.

In the step of performing irradiation with the laser light 108, the single crystal semiconductor layer 104 may be melted together with the non-single-crystal semiconductor layer 106. In that case, it is preferable that the single crystal semiconductor layer 104 be melted not completely but partially (i.e., partial melting). The term "partial melting" means that a portion of the single crystal semiconductor layer 104, which is melted by the irradiation with the laser light 108, has a depth smaller than the distance from the top surface of the single semiconductor layer 104 to the interface with the insulating layer 102 (i.e., the thickness of the single crystal semiconductor layer 104). That is, the state where the single crystal semiconductor layer 104 is partially melted indicates that an upper layer of the single crystal semiconductor layer 104 is melted and is in a liquid phase and a lower layer thereof is a solid-phase single crystal semiconductor without being melted. In that case, crystal growth of the portion melted by the irradiation with the laser light 108 is performed on the basis of a plane orientation of a non-melted portion of the single crystal semiconductor layer.

Further, the range of the energy density of the laser light to melt the non-single-crystal semiconductor layer 106 is set to such an energy density that the single crystal semiconductor layer 104 is not completely melted, in consideration of the wavelength of the laser light, the thickness of the non-single-crystal semiconductor layer 106, and the like.

Figure 1E:
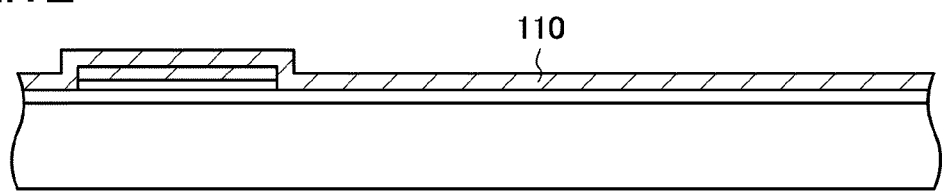

Through the above steps, a semiconductor substrate in which a crystalline semiconductor layer 110 whose top surface has a plane within ±10° from a {211} plane is formed over the substrate 100 can be formed (see FIG. 1E).

The crystalline semiconductor layer 110 has a structure equivalent to the structure of the single crystal semiconductor layer 104. Note that a crystal defect or a dangling bond may be included in the crystalline semiconductor layer 110 as long as the direction of crystal axes of the crystalline semiconductor layer 110 is uniform.

<Method for Manufacturing Semiconductor Device>

Then, a method for manufacturing a semiconductor device including an n-channel transistor and a p-channel transistor with use of the crystalline semiconductor layer 110 provided over the substrate 100 will be described with reference to FIGS. 3A to 3E.

Figure 3A:
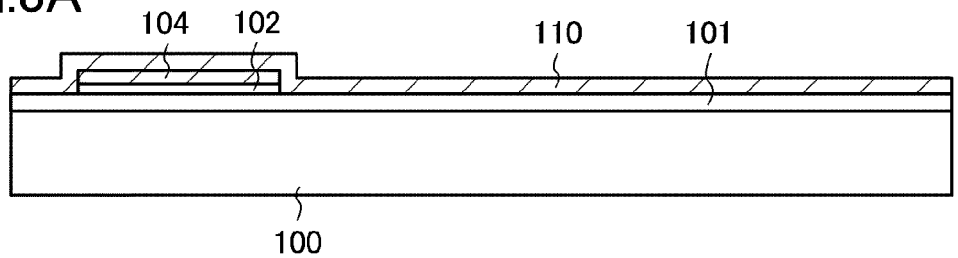
FIGS. 3A to 3E are diagrams illustrating an example of a manufacturing method of a semiconductor device.

First, the semiconductor substrate obtained by the manufacturing steps described with reference to FIGS. 1A to 1E is prepared (see FIG. 3A). Note that FIG. 3A corresponds to FIG. 1E.

Figure 3B:
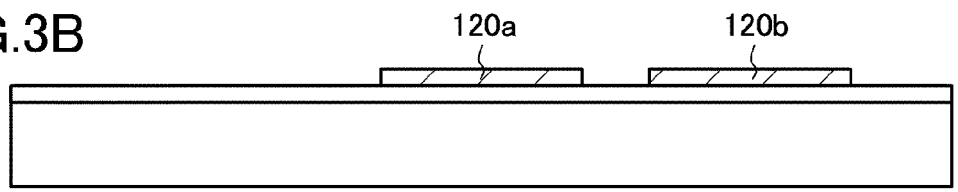
Figure 3C:
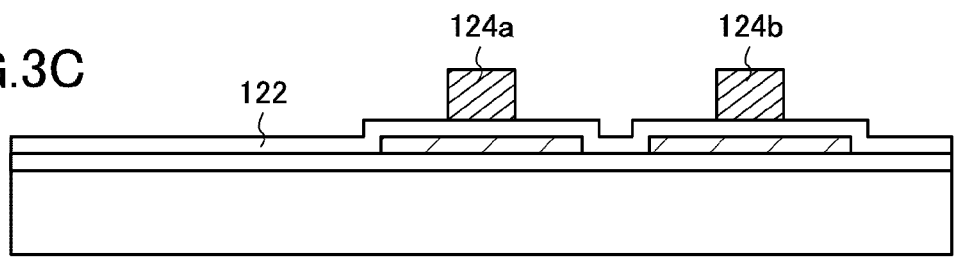

Next, the crystalline semiconductor layer 110 is etched to form island-shaped crystalline semiconductor layers 120a and 120b (see FIG. 3B). Here, the case where the single crystal semiconductor layer 104 used as a seed crystal is removed by etching is described; however, the single crystal semiconductor layer 104 may remain.

Next, an insulating layer 122 is formed so as to cover the crystalline semiconductor layers 120a and 120b. Then, a conductive layer 124a overlapping with the crystalline semiconductor layer 120a and a conductive layer 124b overlapping with the crystalline semiconductor layer 120b are formed over the insulating layer 122 (see FIG. 3C).

The insulating layer 122 can be formed to have a single-layer structure of an insulating layer such as a silicon oxide film, a silicon oxynitride film, a silicon nitride film, or a silicon nitride oxide film, or a stacked-layer structure thereof.

Such an insulating film can be formed by a CVD method, a sputtering method, or the like. The insulating layer 122 functions as a gate insulating layer of a transistor in which the crystalline semiconductor layer 120a serves as a channel layer and a transistor in which the crystalline semiconductor layer 120b serves as a channel layer.

The conductive layers 124a and 124b can be formed to have a single-layer structure using a material such as tantalum (Ta), tungsten (W), titanium (Ti), molybdenum (Mo), aluminum (Al), copper (Cu), chromium (Cr), or niobium (Nb), or a stacked-layer structure thereof. Alternatively, an alloy material containing the above-described metal as its main component or a compound containing the above-described metal can also be used. Further alternatively, a semiconductor material such as polycrystalline silicon, which is obtained by doping a semiconductor with an impurity element that imparts conductivity, or the like may be used. Such a material can be formed by a CVD method, a sputtering method, or the like. The conductive layer 124a functions as a gate electrode of the transistor in which the crystalline semiconductor layer 120a serves as the channel layer, and the conductive layer 124b functions as a gate electrode of the transistor in which the crystalline semiconductor layer 120b serves as the channel layer.

Figure 3D:
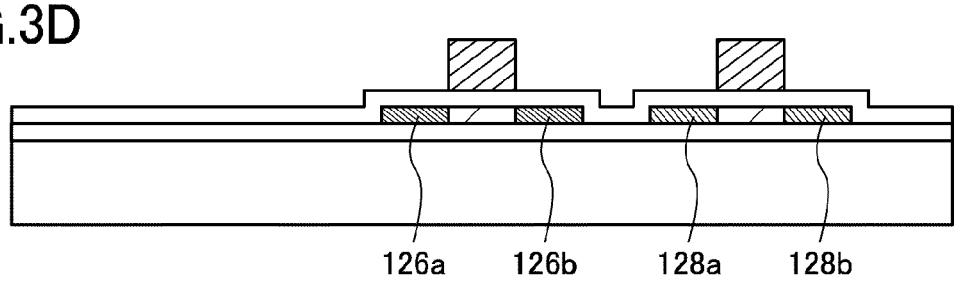
Figure 3E:
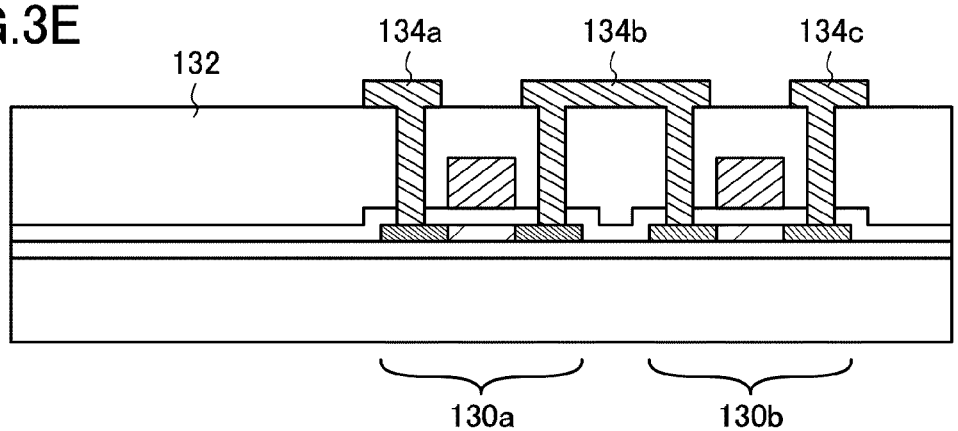

Next, impurity elements are added to the crystalline semiconductor layers 120a and 120b, so that n-type impurity regions 126a and 126b are formed in the crystalline semiconductor layer 120a and p-type impurity region 128a and 128b are formed in the crystalline semiconductor layer 120b (see FIG. 3D).

The impurity regions 126a and 126b function as source and drain regions of the transistor in which the crystalline semiconductor layer 120a serves as the channel layer. The impurity regions 128a and 128b function as source and drain regions of the transistor in which the crystalline semiconductor layer 120b serves as the channel layer.

An impurity element imparting p-type conductivity, such as boron, aluminum, or gallium, and an impurity element imparting n-type conductivity, such as phosphorus or arsenic, may be added as the impurity elements.

Next, an insulating layer 132 is formed so as to cover the conductive layers 124a and 124b and the insulating layer 122. Then, a conductive layer 134a electrically connected to the impurity region 126a, a conductive layer 134b electrically connected to the impurity region 126b and the impurity region 128a, and a conductive layer 134c electrically connected to the impurity region 128b are formed over the insulating layer 132 (see FIG. 3E).

The insulating layer 132 can be formed using an inorganic insulating material such as silicon oxide or silicon oxynitride, or an organic insulating material such as polyimide or acrylic. The insulating layer 132 may have a single-layer structure or a stacked-layer structure in which a plurality of insulating layers are stacked.

The conductive layers 134a to 134c can be formed to have a single-layer structure of a metal including an element selected from aluminum (Al), copper (Cu), titanium (Ti), tantalum (Ta), tungsten (W), molybdenum (Mo), chromium (Cr), neodymium (Nd), and scandium (Sc), an alloy containing any of the above elements, a nitride containing any of the above elements, or the like, or a stacked-layer structure thereof. These materials can be formed by a sputtering method, a vacuum evaporation method, or the like.

Through the above steps, an n-channel transistor 130a in which the crystalline semiconductor layer 120a serves as a channel layer and a p-channel transistor 130b in which the crystalline semiconductor layer 120b serves as a channel layer can be formed.

In the structures of the transistors described in this embodiment, it is preferable that the channel length direction of each of the n-channel transistor 130a and the p-channel transistor 130b be in a <111> direction. When the channel length direction is in a <111> direction, difference in mobility between the n-channel transistor and the p-channel transistor can be reduced. Accordingly, the size of the channel layer (the channel length L, and the channel width W) included in the n-channel transistor and that included in the p-channel transistor can be substantially the same, so that variation of signals which results from difference in values of capacitance can be suppressed.

Note that in this embodiment, a CMOS circuit is formed using the n-channel transistor 130a and the p-channel transistor 130b; however, a circuit that can be formed is not limited thereto. In addition, the structures of the transistors 130a and 130b described in this embodiment can employ various modes, without being limited to the structures illustrated in the drawing.

<Advantage of Using {211} Plane>

Next, an advantage of using a {211} plane as a top surface of a channel layer in a transistor will be described on the basis of simulations.

The mobility μ of a transistor is represented by the formula (1).

[Formula 1]

$$\mu = \frac{e\tau}{m} \quad (1)$$

Here, τ represents a relaxation time, and m represents effective mass. Note that the formula (1) is satisfied in the case where μ and τ are isotropic.

When the formula (1) is applied to the case where μ and τ are anisotropic, the formula (2) is satisfied.

[Formula 2]

$$\mu_{ij} = e\tau \left(\frac{1}{m}\right)_{ij} \quad (2)$$

As seen from the formula (2), μ and 1/m are tensors. Although τ also normally has direction dependence, calculation is performed here on the assumption that τ is isotropic for simplicity. Specifically, the direction dependence of 1/m is calculated to obtain a silicon crystal plane and a channel direction with which the mobility of an n-type carrier and that of a p-type carrier become substantially the same. As a result, it is found that the mobility of the n-type carrier and that of the p-type carrier become substantially the same in a <111> direction of a {211} plane.

As described above, the mobility of the n-type carrier and that of the p-type carrier become substantially the same in the <111> direction of the {211} plane. Therefore, in the case where an n-channel transistor and a p-channel transistor are formed with use of these characteristics, the size of a channel layer (the channel length L, and the channel width W) in the n-channel transistor and that in the p-channel transistor can be substantially the same. Accordingly, variation of signals which results from difference in values of capacitance can be suppressed.

Modified Example

Note that the case where the crystalline semiconductor layer 110 is formed with the use of one single crystal semiconductor layer 104 is described with reference to FIGS. 1A to 1E and FIGS. 2A and 2B, but one embodiment of the disclosed invention is not limited thereto. A plurality of crystalline semiconductor layers 110 may be provided depending on the size of the substrate 100 which is applied.

Figure 4A:
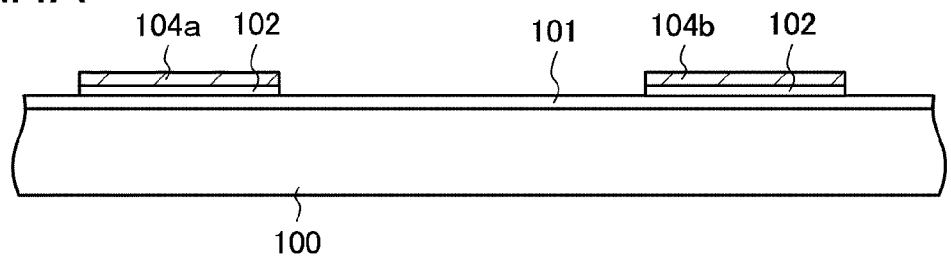
FIGS. 4A to 4C are diagrams illustrating an example of a manufacturing method of a semiconductor substrate.
Figure 4B:
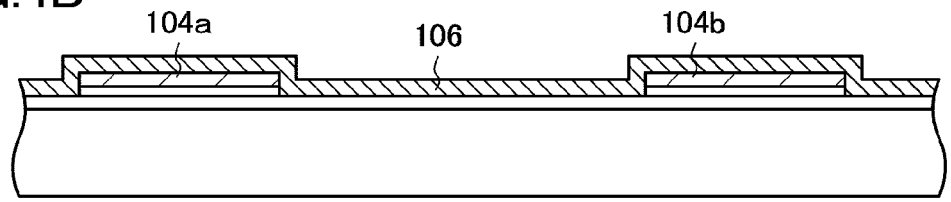
Figure 4C:
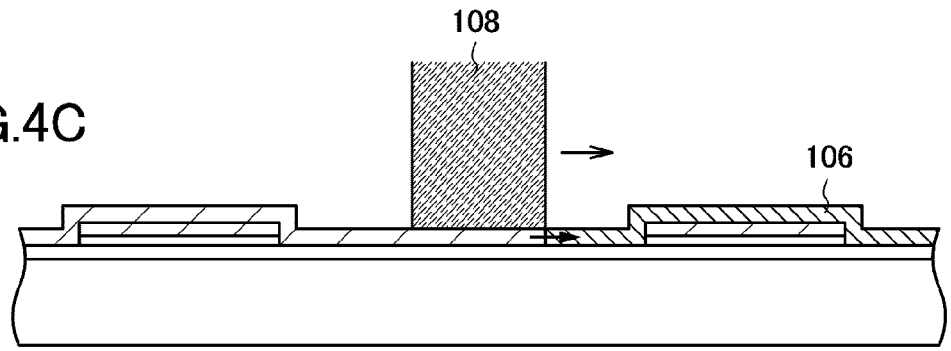

For example, a structure may be employed in which a plurality of single crystal semiconductor layers (here, single crystal semiconductor layers 104a and 104b) are provided at predetermined intervals over the substrate 100 (see FIG. 4A), the non-single-crystal semiconductor layer 106 is formed so as to cover the single crystal semiconductor layers 104a and 104b (see FIG. 4B), and irradiation with the laser light 108 is performed, so that the non-single-crystal semiconductor layer 106 formed over the substrate 100 is crystallized with use of the single crystal semiconductor layers 104a and 104b as seed crystals (see FIG. 4C).

Note that the case where the single crystal semiconductor layer 104 used as a seed crystal is removed by the etching is described with reference to FIGS. 3A to 3E; however, the single crystal semiconductor layer 104 may be used as a channel layer of the transistor. This case is described below with reference to FIGS. 5A to 5E.

Figure 5A:
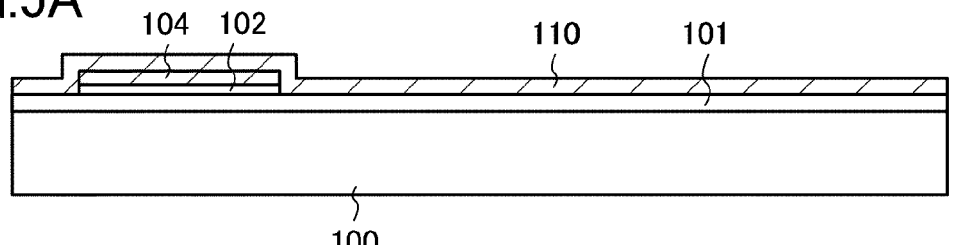
FIGS. 5A to 5E are diagrams illustrating an example of a manufacturing method of a semiconductor device.
Figure 5B:
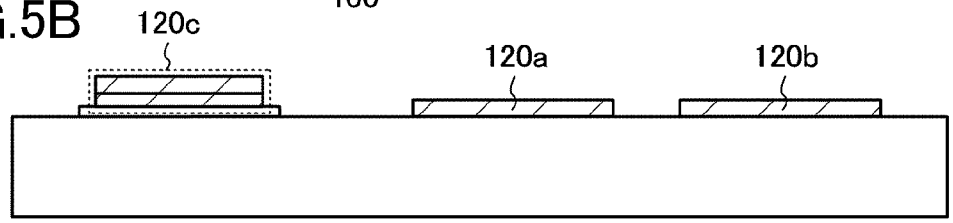

First, the semiconductor substrate obtained through the manufacturing steps described with reference to FIGS. 1A to 1E is prepared (see FIG. 5A), and then, the crystalline semiconductor layer 110 is etched to form the island-shaped crystalline semiconductor layer 120a, the island-shaped crystalline semiconductor layer 120b, and an island-shaped crystalline semiconductor layer 120c (see FIG. 5B). The crystalline semiconductor layer 120c has a stacked-layer structure in which the single crystal semiconductor layer 104 and the non-single-crystal semiconductor layer 106 are crystallized. That is, the crystalline semiconductor layer 120c has a larger thickness than the crystalline semiconductor layers 120a and 120b.

Figure 5C:
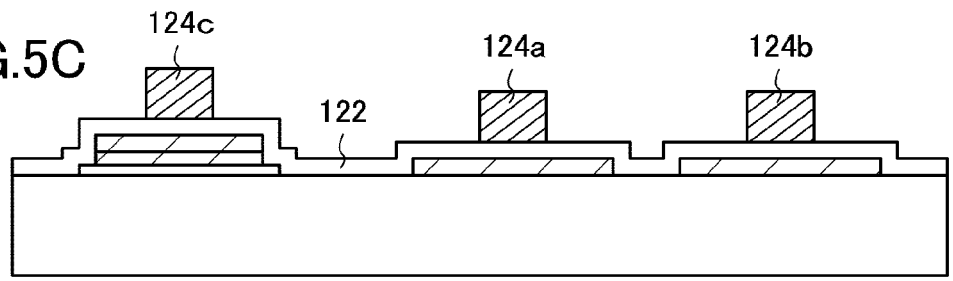

Next, the insulating layer 122 is formed so as to cover the crystalline semiconductor layers 120a, 120b, and 120c, and then, the conductive layer 124a overlapping with the crystalline semiconductor layer 120a, the conductive layer 124b overlapping with the crystalline semiconductor layer 120b, and a conductive layer 124c overlapping with the crystalline semiconductor layer 120c are formed (see FIG. 5C).

Figure 5D:
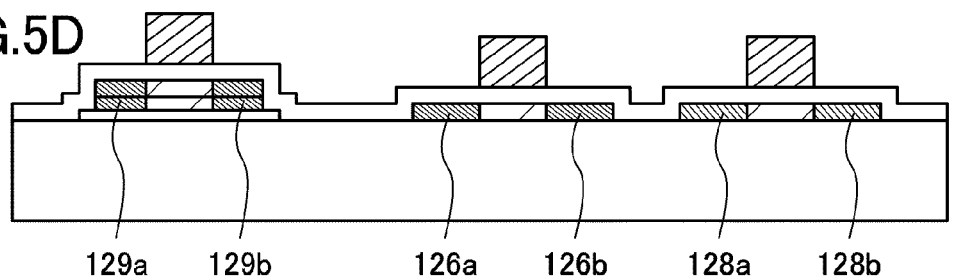
Figure 5E:
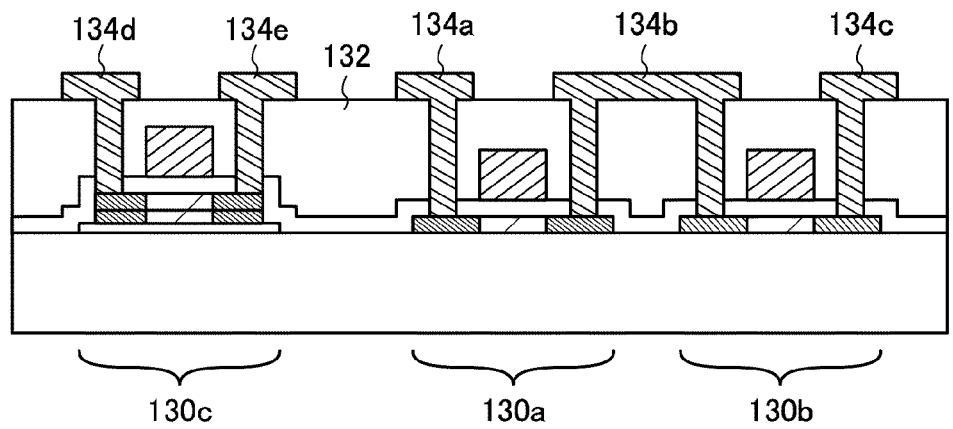

Next, impurity elements are added to the crystalline semiconductor layers 120a, 120b, and 120c, whereby the n-type impurity regions 126a and 126b, the p-type impurity regions 128a and 128b, and n-type or p-type impurity regions 129a and 129b are formed in the crystalline semiconductor layer 120a, the crystalline semiconductor layer 120b, and the crystalline semiconductor layer 120c, respectively (see FIG. 5D).

The impurity regions 129a and 129b functions as source and drain regions of a transistor in which the crystalline semiconductor layer 120c serves as a channel layer.

Next, the insulating layer 132 is formed so as to cover the conductive layers 124a, 124b, and 124c, and the insulating layer 122. Then, the conductive layer 134a electrically connected to the impurity region 126a, the conductive layer 134b electrically connected to the impurity regions 126b and 128a, the conductive layer 134c electrically connected to the impurity region 128b, a conductive layer 134d electrically connected to the impurity region 129a, and a conductive layer 134e electrically connected to the impurity region 129b are formed (see FIG. 5E).

Through the above steps, the n-channel transistor 130a in which the crystalline semiconductor layer 120a serves as a channel layer, the p-channel transistor 130b in which the crystalline semiconductor layer 120b serves as a channel layer, and an n-channel or a p-channel transistor 130c in which the crystalline semiconductor layer 120c serves as a channel layer can be formed. Since the transistor 130c has a thick channel layer, voltage endurance can be enhanced; thus, the transistor 130c can be used in a circuit whose operating voltage is high.

Note that the contents described in each drawing in this embodiment can be freely combined with or replaced with the contents described in another embodiment as appropriate.

Embodiment 2

In this embodiment, one example of a method for manufacturing a semiconductor substrate, which is different from that described in Embodiment 1, will be described with reference to drawings. Note that the manufacturing process (such as applicable materials) described in this embodiment is in common with that of Embodiment 1 in many points. Therefore, description of the same portions is omitted, and different points are described below in detail.

Figure 6A:
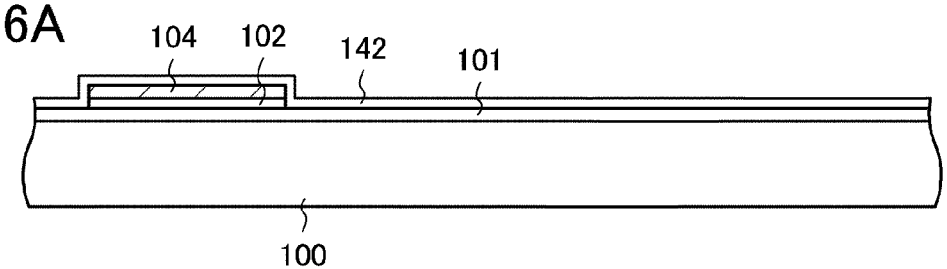
FIGS. 6A to 6E are diagrams illustrating an example of a manufacturing method of a semiconductor substrate.

First, a single crystal semiconductor layer is provided on an insulating surface. Here, a single crystal semiconductor layer 104 whose top surface has a plane within ±10° from a {211} plane is formed over a substrate 100 including an insulating layer 101 with an insulating layer 102 provided therebetween. Then, an insulating layer 142 is formed so as to cover the single crystal semiconductor layer 104 (see FIG. 6A).

The insulating layer 142 can be formed using an insulating layer such as a silicon oxide film, a silicon oxynitride film, a silicon nitride film, or a silicon nitride oxide film. Here, the case where the insulating layer 142 is formed in contact with the top surface and a side surface of the single crystal semiconductor layer 104 and on part of a surface of the substrate 100, which is not covered with the single crystal semiconductor layer 104, is described.

Figure 6B:
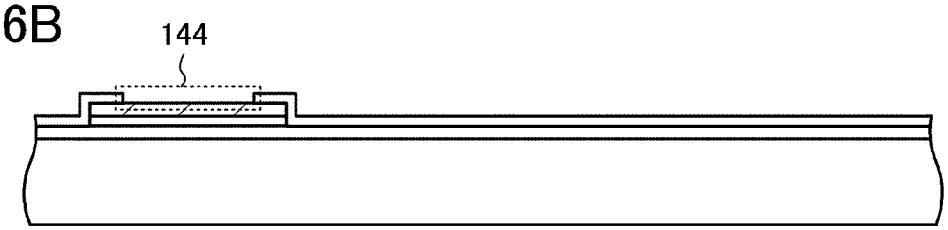

Next, the insulating layer 142 is etched to form an opening 144, whereby the top surface of the single crystal semiconductor layer 104 is exposed (see FIG. 6B). At this time, etching is preferably performed such that the side surface of the single crystal semiconductor layer 104 is not exposed. Further, part of the insulating layer 142, which is formed on the insulating layer 101, may be removed to expose the insulating layer 101.

Figure 6C:
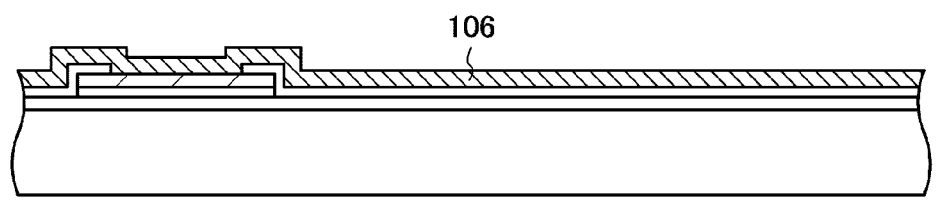

Next, a non-single-crystal semiconductor layer 106 is formed over the single crystal semiconductor layer 104 and the insulating layer 142 (see FIG. 6C). The non-single-crystal semiconductor layer 106 is formed in contact with the exposed top surface of the single crystal semiconductor layer 104 and over the insulating layer 142.

Figure 6D:
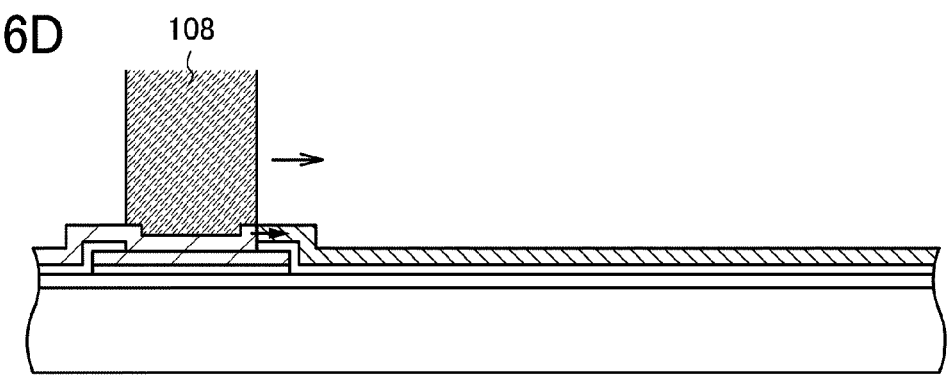

Next, the non-single-crystal semiconductor layer 106 is irradiated with laser light 108 so that the non-single-crystal semiconductor layer 106 is melted, whereby the non-single-crystal semiconductor layer 106 formed over the substrate 100 is crystallized with use of the single crystal semiconductor layer 104 as a seed crystal (see FIG. 6D).

Figure 6E:
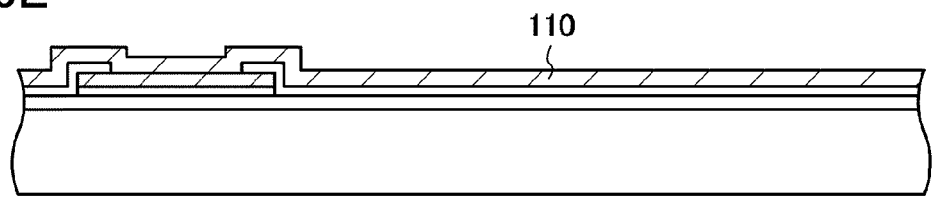

Through the above steps, a semiconductor substrate in which a crystalline semiconductor layer 110 whose top surface has a plane within ±10° from a {211} plane is formed over the substrate 100 with the insulating layer 101 and the insulating layer 142 provided therebetween can be formed (see FIG. 6E).

After that, with use of the obtained crystalline semiconductor layer 110, a p-channel transistor and an n-channel transistor in each of which the crystalline semiconductor layer 110 serves as a channel layer can be formed. The transistors can be formed through steps similar to those illustrated in FIGS. 3A to 3E or FIGS. 5A to 5E.

Note that the contents described in each drawing in this embodiment can be freely combined with or replaced with the contents described in another embodiment as appropriate.

Embodiment 3

In this embodiment, one example of a method for manufacturing a semiconductor substrate, which is different from that described in any of the above embodiments, will be described with reference to drawings. Note that the manufacturing process (such as applicable materials) described in this embodiment is in common with that of Embodiment 1 in many points. Therefore, description of the same portions is omitted, and different points are described below in detail.

Figure 7A:
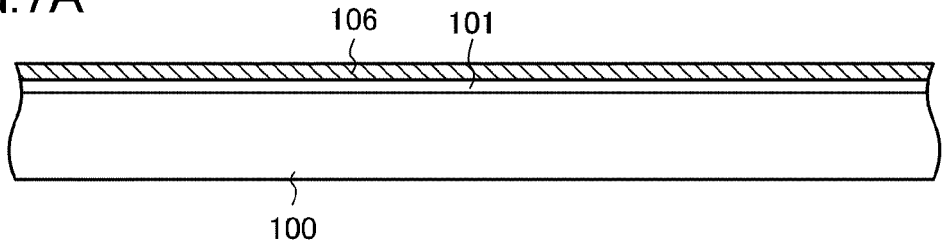
FIGS. 7A to 7E are diagrams illustrating an example of a manufacturing method of a semiconductor substrate.

First, a non-single-crystal semiconductor layer is formed on an insulating surface. Here, a non-single-crystal semiconductor layer 106 is formed over a substrate 100 with an insulating layer 101 provided therebetween (see FIG. 7A).

Figure 7B:
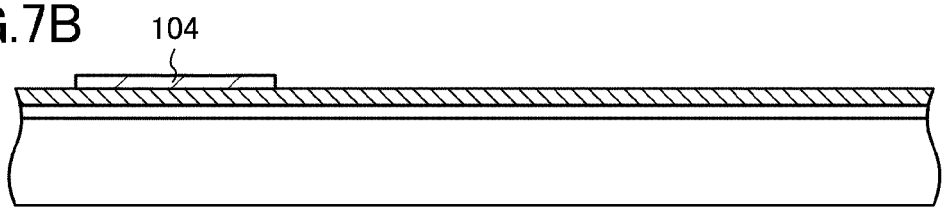

Next, a single crystal semiconductor layer 104 whose bottom surface has a plane within ±10° from a {211} plane is formed over the non-single-crystal semiconductor layer 106 (see FIG. 7B). Here, the bottom surface of the single crystal semiconductor layer 104 corresponds to a surface in contact with the non-single-crystal semiconductor layer 106.

Figure 7C:
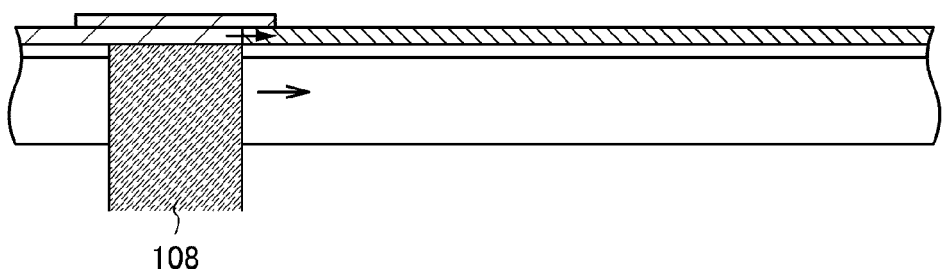
Figure 7D:
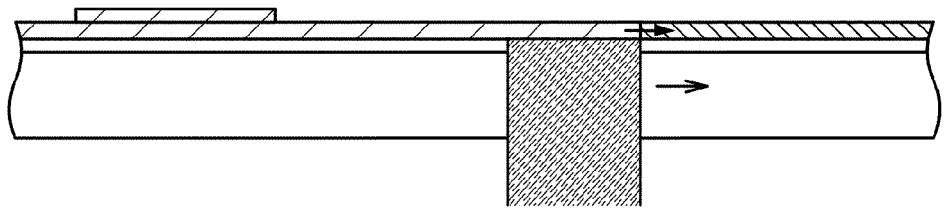

Next, the non-single-crystal semiconductor layer 106 is irradiated with laser light 108 so that the non-single-crystal semiconductor layer 106 is melted (see FIG. 7C), whereby the non-single-crystal semiconductor layer 106 formed over the substrate 100 is crystallized with use of the single crystal semiconductor layer 104 as a seed crystal (see FIG. 7D).

Specifically, part of the non-single-crystal semiconductor layer 106, which is in contact with the bottom surface of the single crystal semiconductor layer 104, is irradiated with the laser light 108, and then, scanning with the laser light 108 is performed; thus, the non-single-crystal semiconductor layer 106 formed over the substrate 100 is continuously melted to form a crystalline semiconductor layer over the substrate 100.

In the case where the non-single-crystal semiconductor layer 106 is melted such that the single crystal semiconductor layer 104 is not completely melted (is partially melted), it is preferable that irradiation with the laser light 108 be performed from a rear surface (the surface opposite to the surface over which the non-single-crystal semiconductor layer 106 is provided) side of the substrate 100 as illustrated in FIG. 7C. In this case, the substrate 100 is preferably formed using a material through which the laser light 108 passes (for example, a glass substrate having a light-transmitting property).

Note that in the case where the non-single-crystal semiconductor layer 106 can be melted without the single crystal semiconductor layer 104 being melted completely, irradiation with the laser light 108 may be performed from the top surface side of the single crystal semiconductor layer 104.

Figure 7E:
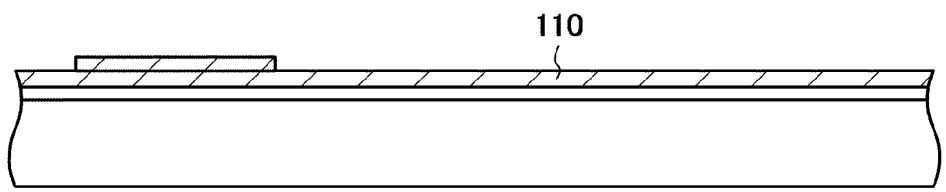

Through the above steps, a semiconductor substrate in which a crystalline semiconductor layer 110 whose top surface has a plane within ±10° from a {211} plane is formed over the substrate 100 with the insulating layer 101 provided therebetween can be formed (see FIG. 7E).

After that, with use of the obtained crystalline semiconductor layer 110, a p-channel transistor and an n-channel transistor in each of which the crystalline semiconductor layer 110 serves as a channel layer can be formed. The transistors can be formed through steps similar to those illustrated in FIGS. 3A to 3E or FIGS. 5A to 5E.

Note that the contents described in each drawing in this embodiment can be freely combined with or replaced with the contents described in another embodiment as appropriate.

Embodiment 4

In this embodiment, one example of a method for manufacturing an island-shaped single crystal semiconductor layer whose top surface has a plane within ±10° from a {211} plane will be described with reference to FIGS. 8A to 8G, FIGS. 9A to 9G, FIGS. 10A to 10G and FIGS. 11A to 11G. Note that FIGS. 8A to 8G, FIGS. 9A to 9G, FIGS. 10A to 10G, and FIGS. 11A to 11G are drawings for illustrating different manufacturing methods, but they have many points similar to each other; therefore, different points will be mainly described, and the detailed description of the structures of the similar points will be omitted in some cases.

<First Mode>

First, a manufacturing method according to First Mode will be described with reference to FIGS. 8A to 8G.

Figure 8A:
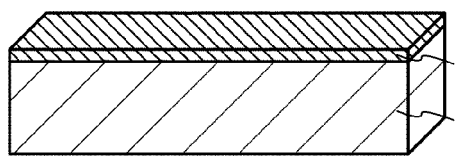
FIGS. 8A to 8G are diagrams illustrating an example of a manufacturing method of a semiconductor substrate.

First, a base substrate 200 is prepared, and an insulating layer 202 is formed over the substrate 200 (see FIG. 8A). As the base substrate 200, a light-transmitting glass substrate which is used for a liquid crystal display device or the like can be used. A substrate having a strain point of 580° C. or higher (preferably 600° C. or higher) is preferably used as the glass substrate. Further, it is preferable that the glass substrate be a non-alkali glass substrate. As a material of the non-alkali glass substrate, a glass material such as aluminosilicate glass, aluminoborosilicate glass, or barium borosilicate glass is used, for example.

Note that, as the base substrate 200, as well as the glass substrate, a substrate which is formed with an insulator, such as a ceramic substrate, a quartz substrate, or a sapphire substrate; a substrate which is formed with a semiconductor such as silicon; a substrate which is formed with a conductor such as metal or stainless steel; or the like can be used.

A method for forming the gate insulating layer 202 is not particularly limited to a certain method, and for example, a sputtering method, a plasma CVD method, or the like can be used. The insulating layer 202 is a layer having a surface to be bonded; therefore, the surface preferably has high planarity. The insulating layer 202 can be formed using one or more materials selected from silicon oxide, silicon nitride, silicon oxynitride, silicon nitride oxide, aluminum oxide, aluminum nitride, aluminum oxynitride, aluminum nitride oxide, and the like. For example, when the insulating layer 202 is formed using silicon oxide by a chemical vapor deposition method with use of an organosilane gas, the insulating layer 202 which is extremely superior in planarity can be obtained. Note that the insulating layer 202 may have a single-layer structure or a stacked-layer structure.

Note that the insulating layer 202 has a single-layer structure in this embodiment; however, it may have a stacked-layer structure. A structure in which the insulating layer 202 is not provided may be employed as long as a problem does not particularly occur in bonding.

Figure 8B:
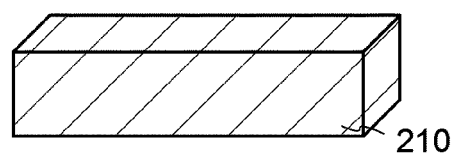
Figure 8C:
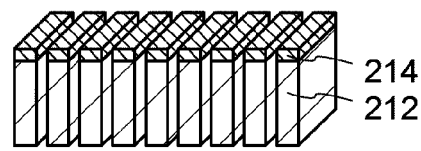

Next, a single crystal semiconductor substrate 210 is prepared (see FIG. 8B). As the single crystal semiconductor substrate 210, for example, a semiconductor substrate formed using an element belonging to Group 14 of the periodic table, such as silicon, germanium, silicon germanium, or silicon carbide can be used. In this embodiment, a single crystal silicon substrate whose top surface has a plane within ±10° from a {211} plane is used as the single crystal semiconductor substrate 210.

Although there is no limitation on the size of the single crystal semiconductor substrate 210, a semiconductor substrate having a diameter of 8 inches (200 mm), 12 inches (300 mm), or 18 inches (450 mm) can be used, for example. Further, a circular semiconductor substrate may be processed into a rectangular shape to be used.

Next, the single crystal semiconductor substrate 210 is divided to form single crystal semiconductor substrates 212. Then, an insulating layer 214 is formed on a surface of each of the single crystal semiconductor substrates 212 (see FIG. 8C). The insulating layer 214 can be formed in a manner similar to the formation of the insulating layer 202; therefore, the detailed description of the formation of the insulating layer 214 is omitted here. Note that in this embodiment, the single crystal semiconductor substrates 212 are formed by division of the single crystal semiconductor substrate 210; however, one embodiment of the disclosed invention is not limited thereto. Alternatively, single crystal semiconductor substrates which have been divided so as to have a predetermined size may be used, and the insulating layer 214 may be formed thereover. Further alternatively, the single crystal semiconductor substrate 210 may be divided after the insulating layer 214 is formed.

Note that the insulating layer 214 has a single-layer structure in this embodiment; however, it may have a stacked-layer structure. A structure in which the insulating layer 214 is not provided may be employed as long as a problem does not particularly occur in bonding.

Figure 8D:
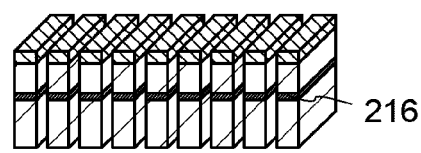

Ions are added to the single crystal semiconductor substrates 212, so that embrittled regions 216 are formed (see FIG. 8D). Specifically, for example, irradiation with an ion beam including ions accelerated by an electric field is performed, so that the embrittled regions 216 are formed at predetermined depths from the surfaces of the single crystal semiconductor substrates 212. The depths at which the embrittled regions 216 are formed are controlled by the accelerating energy of the ion beam and the incident angle thereof. That is, the embrittled regions 216 are formed in regions at depths which are the same or substantially the same as the average penetration depth of the ions. Here, the depths at which the embrittled regions 216 are formed are preferably uniform in all the single crystal semiconductor substrates 212. Further, each of the surfaces to be irradiated with the ions preferably has a plane within ±10° from a {211} plane. Accordingly, the single crystal semiconductor substrates 212 can be split along crystal planes which are equivalent to the planes of the surfaces of the single crystal semiconductor substrates 212 (i.e., planes within ±10° from a {211} plane). In other words, top surfaces of single crystal semiconductor layers formed by splitting the single crystal semiconductor substrates 212 each can have a plane within ±10° from a {211} plane.

The depth at which the embrittled region 216 is formed determines the thickness of the semiconductor layer which is split from the single crystal semiconductor substrate 212. The depth at which the embrittled region 216 is formed is greater than or equal to 50 nm and less than or equal to 1 μm, preferably greater than or equal to 50 nm and less than or equal to 300 nm from the surface of the single crystal semiconductor substrate 212.

An ion implantation apparatus or an ion doping apparatus can be used in order to add ions to the single crystal semiconductor substrates 212. In an ion implantation apparatus, a source gas is excited to generate ion species, the produced ion species are mass-separated, and an object to be processed is irradiated with the ion species having a predetermined mass. In an ion doping apparatus, a process gas is excited to produce ion species, the produced ion species are not mass-separated, and an object to be processed is irradiated with the produced ion species. Note that in the ion doping apparatus provided with a mass separator, ion irradiation with mass separation can also be performed as in the ion implantation apparatus.

In the case of using an ion doping apparatus, the embrittled region 216 can be formed under the following conditions, for example.

Accelerating voltage is greater than or equal to 10 kV and less than or equal to 100 kV (preferably greater than or equal to 30 kV and less than or equal to 80 kV).

Dose is greater than or equal to $1 \times 10^{16}/cm^2$ and less than or equal to $4 \times 10^{16}/cm^2$.

Beam current density is greater than or equal to $2 \mu A/cm^2$ (preferably greater than or equal to $5 \mu A/cm^2$, more preferably greater than or equal to $10 \mu A/cm^2$).

In the case of using an ion doping apparatus, a gas containing hydrogen can be used as a source gas. With the gas containing hydrogen, $H^+$, $H_2^+$, and $H_3^+$ can be produced as ion species. In the case where a hydrogen gas is used as a source gas, it is preferable to perform irradiation with a large amount of $H_3^+$. Specifically, it is preferable that the ion beam contain $H_3^+$ ions at a proportion of 70% or higher with respect to the total amount of $H^+$, $H_2^+$, and $H_3^+$ ions. It is more preferable that the proportion of $H_3^+$ ions be higher than or equal to 80%. By increasing the proportion of $H_3^+$ ions in this manner, the embrittled region 216 can contain hydrogen at a concentration of higher than or equal to $1 \times 10^{20}$ atoms/cm$^3$. Accordingly, the single crystal semiconductor substrate 212 can be split along the embrittled region 216 easily. By addition of a larger amount of $H_3^+$ ions, the embrittled region 216 can be formed in a shorter period of time as compared with the case of performing addition of $H^+$ ions and $H_2^+$ ions. Moreover, with the use of $H_3^+$, the average penetration depth of ions can be made shallower; thus, the embrittled region 216 can be formed at a shallower region.

In the case of using an ion implantation apparatus, it is preferable to perform irradiation with $H_3^+$ ions through mass separation. Of course, irradiation with $H^+$ ions or $H_2^+$ ions may be performed. Note that, since ion species are selected to perform irradiation in the case of using an ion implantation apparatus, ion irradiation efficiency is decreased as compared with the case of using an ion doping apparatus, in some cases.

As a source gas for the ion irradiation step, as well as a gas containing hydrogen, one or more kinds of gases selected from a rare gas such as helium or argon; a halogen gas typified by a fluorine gas or a chlorine gas; or a halogen compound gas such as a fluorine compound gas (e.g., $BF_3$) can be used. When helium is used for a source gas, an ion beam with high proportion of $He^+$ ions can be formed without mass separation. With use of such ion beams, the embrittled region 216 can be formed efficiently.

Further, the embrittled region 216 may be formed through a plurality of ion irradiation steps. In this case, different source gases may be used for ion irradiation or the same source gas may be used for the ion irradiation. For example, ion irradiation can be performed using a gas containing hydrogen as a source gas after ion irradiation is performed using a rare gas as a source gas. Alternatively, ion irradiation may be performed first using a halogen gas or a halogen compound gas, and then, ion irradiation may be performed using a gas containing hydrogen.

Note that in this embodiment, a structure is employed in which the single crystal semiconductor substrate 210 is divided into the single crystal semiconductor substrates 212, the insulating layers 214 are formed, and the embrittled regions 216 are formed; however, one embodiment of the disclosed invention is not limited thereto. Alternatively, a structure may be employed in which the insulating layer 214 and the embrittled region 216 are formed before the single crystal semiconductor substrate 210 is divided into the single crystal semiconductor substrates 212, and then, the single crystal semiconductor substrate 210 is divided into the single crystal semiconductor substrates 212.

Figure 8E:
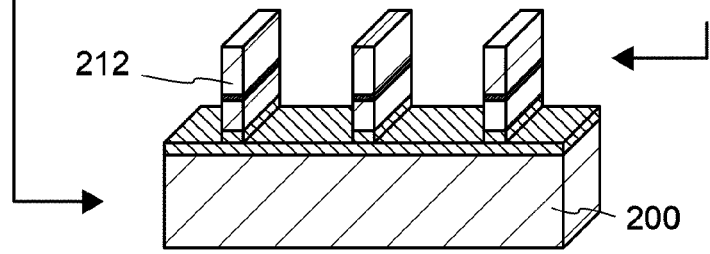

After that, the base substrate 200 and the single crystal semiconductor substrates 212 are bonded to each other (see FIG. 8E). Specifically, the base substrate 200 and the single crystal semiconductor substrates 212 are bonded to each other with the insulating layer 202 and the insulating layers 214 provided therebetween. Note that a surface of the insulating layer 202 and surfaces of the insulating layers 214, which are used for the bonding, are desirably washed by a method such as ultrasonic cleaning before the bonding. After the surface of the insulating layer 202 and the surfaces of the insulating layers 214 are made in contact with each other, pressure treatment is performed, whereby bonding between the base substrate 200 and the single crystal semiconductor substrates 212 is achieved. Note that van der Waals force, hydrogen bonding, or the like seems to act on a mechanism of the bonding.

Note that the surfaces which are used for the bonding may be subjected to oxygen plasma treatment or ozone treatment so that the surfaces become hydrophilic. By this treatment, hydroxyl is added to the bonding surfaces, so that a hydrogen bond can be formed at a bonding interface.

After the bonding, heat treatment is performed on the base substrate 200 and the single crystal semiconductor substrates 212, which are bonded to each other, so that bonding strength is increased. The heat temperature at this time needs to be a temperature that does not promote split along the embrittled regions 216. For example, the temperature is set to lower than 400° C., preferably 300° C. or lower. Heat treatment time is not particularly limited and may be optimally set as appropriate depending on the relation between processing time and bonding strength. For example, heat treatment can be performed at 200° C. for 2 hours. Note that only the region which is used for the bonding can be locally heated by being irradiated with microwaves or the like. Note that when there is no problem with the bonding strength, the heat treatment may be omitted.

Figure 8F:
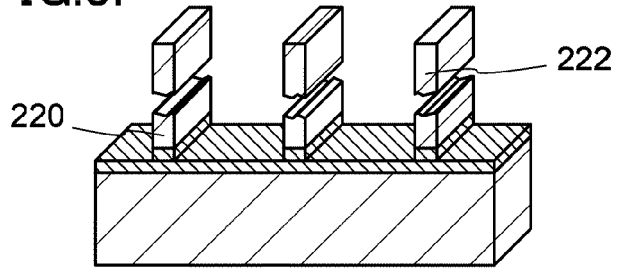

Next, each of the single crystal semiconductor substrates 212 is split along the embrittled region 216 into a single crystal semiconductor layer 220 and an island-shaped single crystal semiconductor substrate 222 (see FIG. 8F). The single crystal semiconductor substrates 212 are preferably split by heat treatment. The temperature of the heat treatment can be set in consideration of the allowable temperature limit of the base substrate 200. For example, when a glass substrate is used as the base substrate 200, the temperature of the heat treatment is preferably higher than or equal to 400° C. and lower than or equal to 750° C. However, the temperature of the heat treatment is not limited to the above range as long as the glass substrate can withstand the temperature. Note that in this embodiment, the heat treatment is performed at 600° C. for two hours.

By performing the above-described heat treatment, the volume of microvoids formed in the embrittled region 216 is changed, and a crack is generated in the embrittled region 216. As a result, each of the single crystal semiconductor substrates 212 is split along the embrittled region 216. Accordingly, the single crystal semiconductor substrate layers 220 each of which is split from the single crystal semiconductor substrate 212 remain over the base substrate 200. Further, since the interface which is used for the bonding is heated by this heat treatment, a covalent bond is formed at the interface, so that the bonding can be further strengthened.

Here, in each of the single crystal semiconductor substrates 212, the surface having a plane within ±10° from a {211} plane is used for bonding; therefore, when each of the single crystal semiconductor substrate 212 is split along the embrittled region 216 parallel to the surface, the single crystal semiconductor layers 220 whose top surfaces each have a plane within ±10° from a {211} plane can be formed.

Defects due to the split step or the ion irradiation step exist on the surfaces of the single crystal semiconductor layers 220 which are formed through the above steps, and the planarity of the surfaces of the single crystal semiconductor layers 220 is impaired. Therefore, treatment for reducing the defects in the single crystal semiconductor layers 220 or treatment for improving the planarity of the surfaces of the single crystal semiconductor layers 220 may be performed.

In this embodiment, reduction in the defects and improvement in the planarity of the single crystal semiconductor layers 220 can be realized by irradiation of the single crystal semiconductor layers 220 with laser light, for example. The single crystal semiconductor layers 220 are irradiated with laser light, so that the single crystal semiconductor layers 220 are melted and then cooled to be solidified; therefore, single crystal semiconductor layers in each of which defects are reduced and surface planarity is improved can be obtained.

A step of reducing the thickness of the single crystal semiconductor layers may be performed. In order to thin the semiconductor layers, one of a dry etching process or a wet etching process or a combination of both the etching processes may be performed. For example, in the case where the semiconductor layers are formed from silicon, the semiconductor layers can be thinned by a dry etching process using $SF_6$ and $O_2$ as process gases.

Figure 8G:
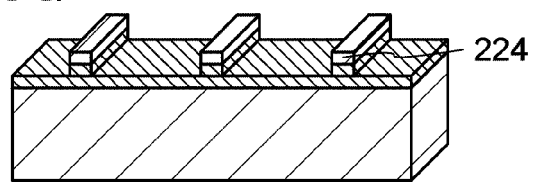

Through the above steps, island-shaped single crystal semiconductor layers 224 whose top surfaces each have a plane within ±10° from a {211} plane can be formed over the base substrate 200 (see FIG. 8G).

Note that in this embodiment, reduction in defects and improvement in planarity are realized with use of laser light; however, one embodiment of the disclosed invention is not limited thereto. Reduction in defects and improvement in planarity may be realized with use of another method such as heat treatment. Further, only treatment for improving planarity, such as etching treatment, may be performed if treatment for reducing defects is unnecessary.

In First Mode, single crystal semiconductor layers are formed with use of only a single crystal semiconductor substrate, which is part of divided single crystal semiconductor substrates. That is, with use of one single crystal semiconductor substrate, single crystal semiconductor layers can be formed over a plurality of base substrates. Accordingly, manufacturing cost of a semiconductor substrate and a semiconductor device can be reduced.

<Second Mode>

Next, a manufacturing method according to Second Mode will be described with reference to FIGS. 9A to 9G. Second Mode is different from First Mode in that the single crystal semiconductor substrate 210 is not divided. Therefore, this point is mainly described below.

First, a base substrate 200 is prepared, and an insulating layer 202 is formed over the base substrate 200 (see FIG. 9A). First Mode may be referred to for the detailed description thereof.

Next, a single crystal semiconductor substrate 210 is prepared (see FIG. 9B). First Mode can be referred to for the detailed description thereof.

Next, an insulating layer 214 is formed on a surface of the single crystal semiconductor substrate 210, and ions are added to the single crystal semiconductor substrate 210, whereby an embrittled region 216 is formed (see FIG. 9C). First Mode can be referred to for the detailed description of the insulating layer 214 and the embrittled region 216.

After that, the single crystal semiconductor substrate 210 (including part of the embrittled region 216) and the insulating layer 214 are selectively etched, so that recessed portions are formed (see FIG. 9D). Thus, the recessed portions and the other portions are formed in the single crystal semiconductor substrate 210. Hereinafter, the portions which are projected by the formation of the recessed portions are referred to as "projection portions".

After that, the base substrate 200 and the single crystal semiconductor substrate 210 are bonded to each other (see FIG. 9E). Specifically, the base substrate 200 and the projection portions of the single crystal semiconductor substrate 210 are bonded to each other with the insulating layer 202 and the insulating layer 214 provided therebetween. The detail is similar to that in the case of bonding the base substrate 200 and the single crystal semiconductor substrates 212 in First Mode; therefore, the description thereof may be referred to.

Next, the single crystal semiconductor substrate 210 is split along the embrittled region 216 into single crystal semiconductor layers 220 and a single crystal semiconductor substrate 222 (see FIG. 9F). First Mode can be referred to for the detailed description thereof.

After that, treatment for reducing defects, treatment for improving planarity of surfaces, or the like is performed, so that island-shaped single crystal semiconductor layers 224 whose top surfaces each have a plane within ±10° from a {211} plane can be formed over the base substrate 200 (see FIG. 9G). First Mode may be referred to for the treatment for reducing defects, the treatment for improving planarity of surfaces, or the like.

With use of the above manufacturing method according to Second Mode, island-shaped single crystal semiconductor layers whose top surfaces each have a plane within ±10° from a {211} plane can be formed as in the case of using the manufacturing method according to First Mode. Note that in Second Mode, a single crystal semiconductor substrate does not have to be divided, so that there is an advantage that the single crystal semiconductor substrate can be easily handled.

<Third Mode>

Next, a manufacturing method according to Third Mode will be described with reference to FIGS. 10A to 10G. Third Mode is different from First Mode in that a non-single crystal semiconductor layer is formed over the base substrate 200. Therefore, this point is mainly described below.

First, a base substrate 200 is prepared, and an insulating layer 202 is formed over the base substrate 200, and then, a non-single-crystal semiconductor layer 230 is formed over the insulating layer 202 (see FIG. 10A). First Mode can be referred to for the detailed description of the base substrate 200 and the insulating layer 202. The non-single-crystal semiconductor layer 230 can be formed using a material similar to that of a single crystal semiconductor substrate which will be described later. That is, in the case where a silicon substrate is used as the single crystal semiconductor substrate, the non-single-crystal semiconductor layer 230 is formed using silicon. The non-single-crystal semiconductor layer 230 may be formed by a CVD method or a sputtering method. Note that there is no particular limitation on the crystallinity, the thickness, or the like of the non-single-crystal semiconductor layer 230.

Next, a single crystal semiconductor substrate 210 is prepared (see FIG. 10B). First Mode can be referred to for the detailed description thereof.

Next, the single crystal semiconductor substrate 210 is divided to form single crystal semiconductor substrates 212 (see FIG. 10C). First Mode can be referred to for the detailed description of this step.

Ions are added to the single crystal semiconductor substrates 212, so that embrittled regions 216 are formed (see FIG. 10D). Note that in Third Mode, an insulating layer is not formed on a surface of each of the single crystal semiconductor substrates 212. This is because the non-single-crystal semiconductor layer 230 formed over the base substrate 200 and the surfaces of the single crystal semiconductor substrates 212 should be in contact with each other. First Mode can be referred to for the detailed description of the embrittled regions 216.

After that, the base substrate 200 and the single crystal semiconductor substrates 212 are bonded to each other (see FIG. 10E). Specifically, the base substrate 200 and the single crystal semiconductor substrates 212 are bonded to each other with the insulating layer 202 and the non-single-crystal semiconductor layer 230 provided therebetween. The detail is similar to that in the case of bonding the base substrate 200 and the single crystal semiconductor substrates 212 in First Mode; therefore, the description thereof can be referred to.

Next, each of the single crystal semiconductor substrates 212 is split along the embrittled region 216 into a single crystal semiconductor layer 220 and a single crystal semiconductor substrate 222 (see FIG. 10F). First Mode can be referred to for this step.

After that, treatment for reducing defects, treatment for improving planarity of surfaces, or the like is performed, so that island-shaped single crystal semiconductor layers 224 whose top surfaces each have a plane within ±10° from a {211} plane can be formed over the base substrate 200 (see FIG. 10G). First Mode may be referred to for the treatment for reducing defects, the treatment for improving planarity of surfaces, or the like.

With use of the above manufacturing method according to Third Mode, island-shaped single crystal semiconductor layers whose top surfaces each have a plane within ±10° from a {211} plane can be formed over a non-single-crystal semiconductor layer.

<Fourth Mode>

Next, a manufacturing method according to Fourth Mode will be described with reference to FIGS. 11A to 11G. Fourth Mode is different from First Mode in that the single crystal semiconductor substrate 210 is not divided and a non-single-crystal semiconductor layer is formed over the base substrate 200. Therefore, this point is mainly described below.

Figure 11A:
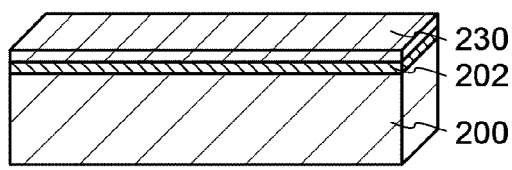
FIGS. 11A to 11G are diagrams illustrating an example of a manufacturing method of a semiconductor substrate.

First, a base substrate 200 is prepared, and an insulating layer 202 is formed over the base substrate 200, and then, a non-single-crystal semiconductor layer 230 is formed over the insulating layer 202 (see FIG. 11A). First Mode can be referred to for the detailed description of the base substrate 200 and the insulating layer 202. Third Mode can be referred to for the detailed description of the non-single-crystal semiconductor layer 230.

Figure 11B:
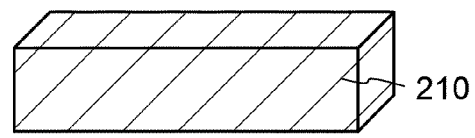

Next, a single crystal semiconductor substrate 210 is prepared (see FIG. 11B). First Mode can be referred to for the detailed description thereof.

Figure 11C:
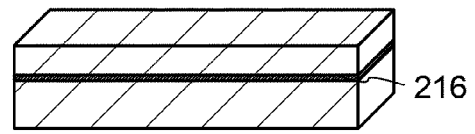
Figure 11D:
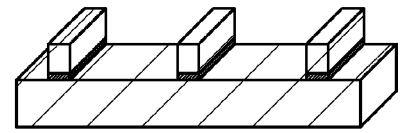

Next, ions are added to the single crystal semiconductor substrate 210, so that an embrittled region 216 is formed (see FIG. 11C). First Mode can be referred to for the detailed description of the embrittled region 216. Note that in Fourth Mode, an insulating layer is not formed on a surface of the single crystal semiconductor substrate 210. This is because the non-single-crystal semiconductor layer 230 formed over the base substrate 200 and the surface of the single crystal semiconductor substrate 210 should be in contact with each other. First Mode can be referred to for the detailed description of the embrittled region 216.

After that, the single crystal semiconductor substrate 210 (including part of the embrittled region 216) is selectively etched, so that recessed portions are formed. Thus, the recessed portions and the other portions are formed in the single crystal semiconductor substrate 210. Hereinafter, the portions which are projected by the formation of the recessed portions are referred to as "projection portions".

Figure 11E:
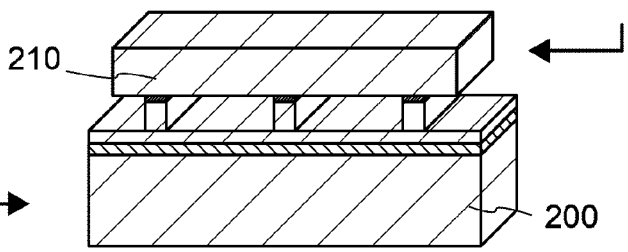

After that, the base substrate 200 and the single crystal semiconductor substrate 210 are bonded to each other (see FIG. 11E). Specifically, the base substrate 200 and the projection portions of the single crystal semiconductor substrate 210 are bonded to each other with the non-single-crystal semiconductor layer 230 provided therebetween. The detail is similar to that in the case of bonding the base substrate 200 and the single crystal semiconductor substrates 212 in First Mode; therefore, the description thereof may be referred to.

Figure 11F:
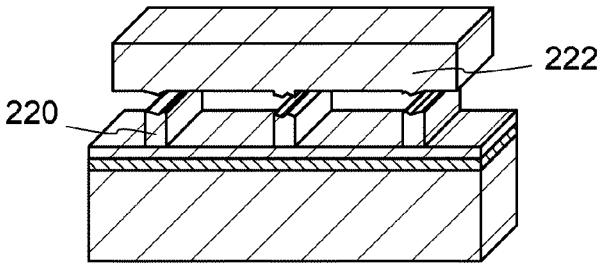

Next, the single crystal semiconductor substrate 210 is split along the embrittled region 216 into single crystal semiconductor layers 220 and a single crystal semiconductor substrate 222 (see FIG. 11F). First Mode can be referred to for the detailed description thereof.

Figure 11G:
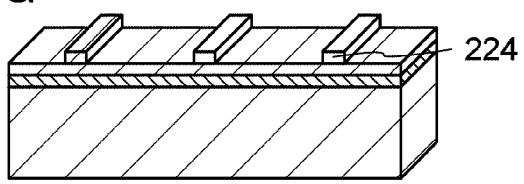

After that, treatment for reducing defects, treatment for improving planarity of surfaces, or the like is performed, so that island-shaped single crystal semiconductor layers 224 whose top surfaces each have a plane within ±10° from a {211} plane can be formed over the base substrate 200 (see FIG. 11G). First Mode may be referred to for the treatment for reducing defects, the treatment for improving planarity of surfaces, or the like.

With use of the above manufacturing method according to Fourth Mode, island-shaped single crystal semiconductor layers whose top surfaces each have a plane within ±10° from a {211} plane can be formed over a non-single-crystal semiconductor layer as in the case of using the manufacturing method according to Third Mode. Note that in Fourth Mode, the single crystal semiconductor substrate does not have to be divided, so that there is an advantage that the single crystal semiconductor substrate can be easily handled.

This embodiment can be implemented in appropriate combination with another embodiment.

Embodiment 5

In this embodiment, specific modes of semiconductor devices will be described with reference to drawings.

Figure 12:
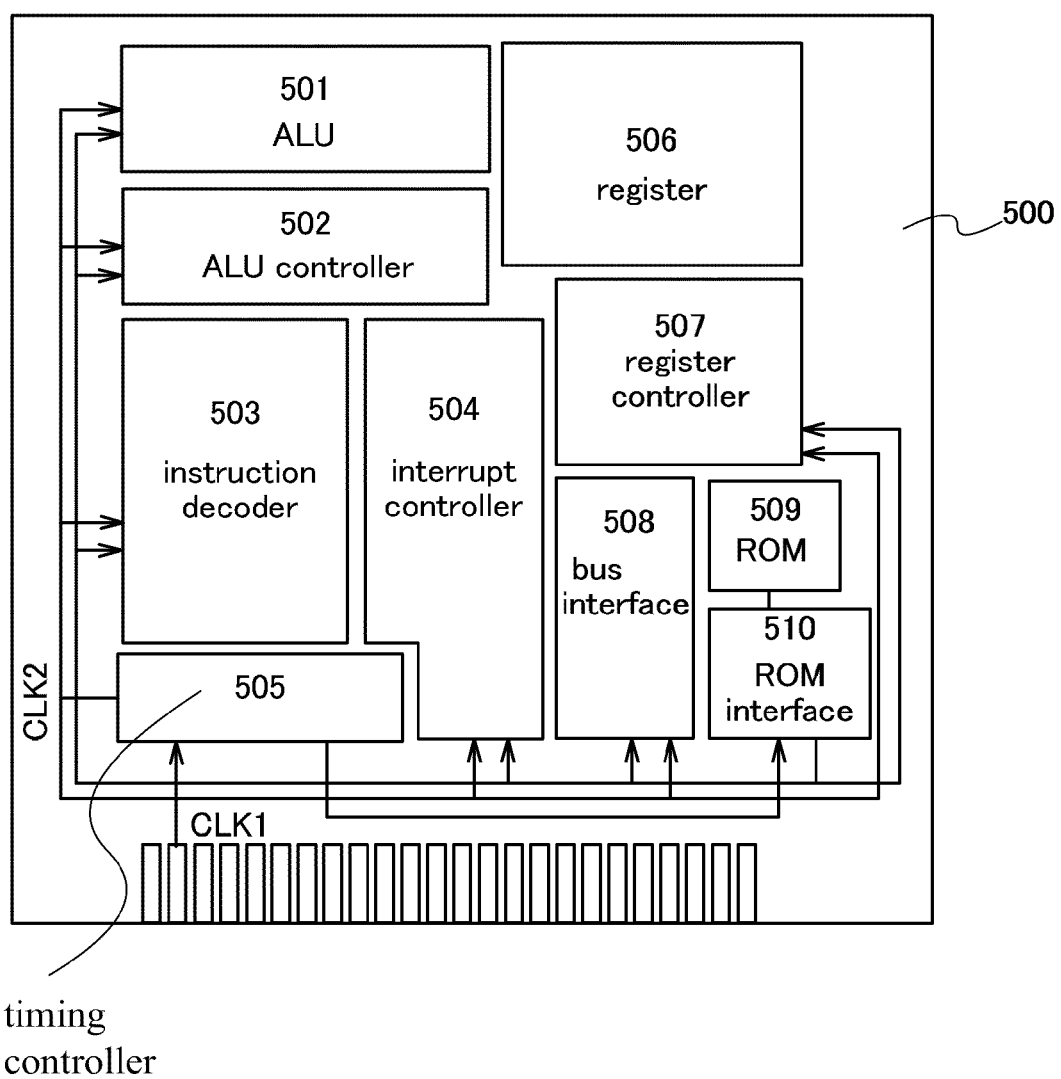
FIG. 12 is a block diagram illustrating a structure of a microprocessor according to one embodiment of the present invention.

First, a microprocessor will be described as an example of semiconductor devices. FIG. 12 is a block diagram illustrating an example of a structure of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read-only memory 509, and a memory interface 510.

An instruction input to the microprocessor 500 via the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction.

The ALU controller 502 generates signals for controlling the operation of the ALU 501. The interrupt controller 504 is a circuit which processes an interrupt request from an external input/output device or a peripheral circuit while the microprocessor 500 is executing a program, and the interrupt controller 504 processes an interrupt request based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 12, the internal clock signal CLK2 is input to other circuits.

Figure 13:
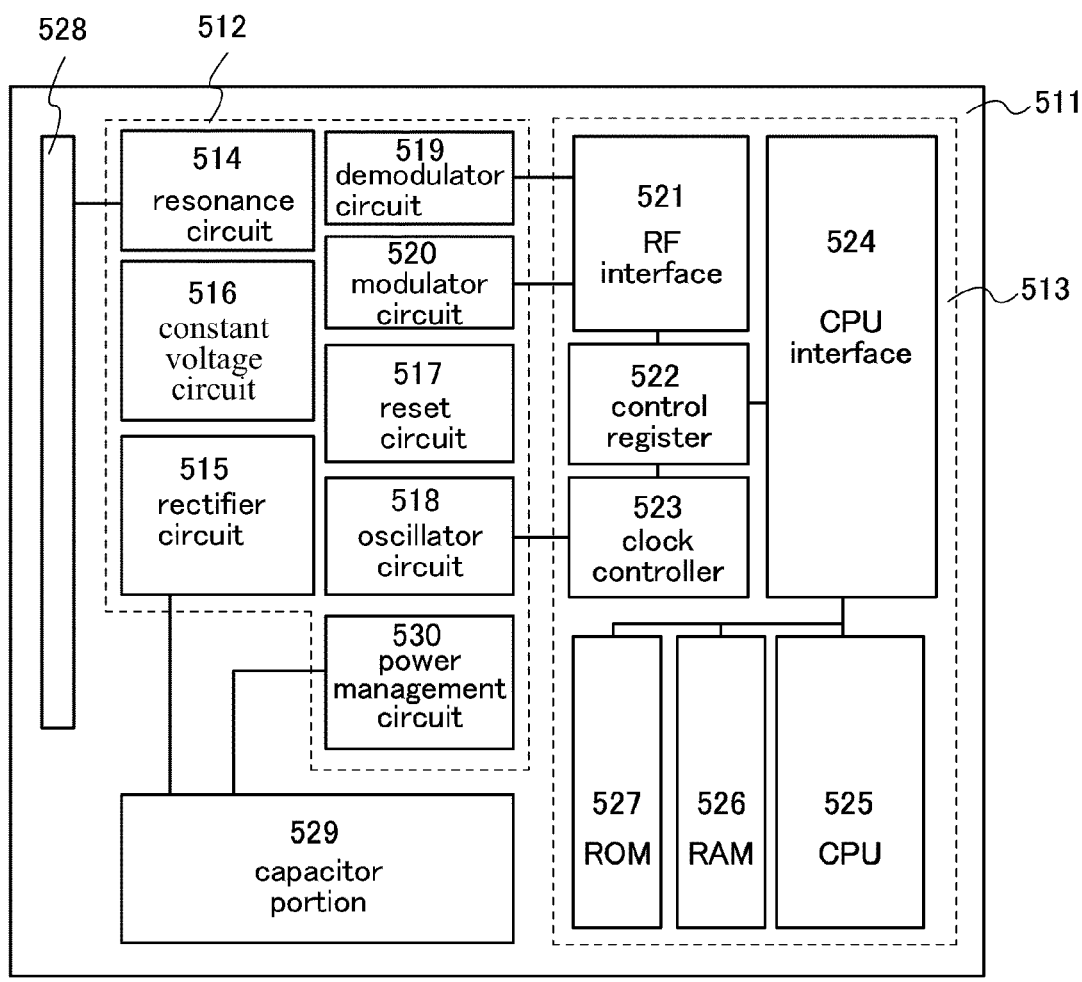
FIG. 13 is a block diagram illustrating a structure of an RFCPU according to one embodiment of the present invention.

Next, an example of a semiconductor device having an arithmetic function and a contactless data transmission and reception function will be described. FIG. 13 is a block diagram illustrating an example of a structure of such a semiconductor device. A semiconductor device illustrated in FIG. 13 can be called a computer that operates to transmit and receive signals to and from an external device by wireless communication (such a computer is hereinafter referred to as an "RFCPU").

As illustrated in FIG. 13, an RFCPU 511 has an analog circuit portion 512 and a digital circuit portion 513. The analog circuit portion 512 has a resonance circuit 514 with a resonance capacitor, a rectifier circuit 515, a constant voltage circuit 516, a reset circuit 517, an oscillator circuit 518, a demodulator circuit 519, a modulator circuit 520, and a power management circuit 530. The digital circuit portion 513 has an RF interface 521, a control register 522, a clock controller 523, a CPU interface 524, a central processing unit 525, a random-access memory 526, and a read-only memory 527.

The operation of the RFCPU 511 is roughly as follows. The resonance circuit 514 generates an induced electromotive force based on a signal received by an antenna 528. The induced electromotive force is stored in a capacitor portion 529 via the rectifier circuit 515. This capacitor portion 529 is preferably formed with a capacitor such as a ceramic capacitor or an electric double layer capacitor. The capacitor portion 529 does not need to be formed over a substrate included in the RFCPU 511 and can be incorporated in the RFCPU 511 as a separate component.

The reset circuit 517 generates a signal for resetting and initializing the digital circuit portion 513. For example, the reset circuit 517 generates a signal which rises after rise in a power supply voltage with delay as a reset signal. The oscillator circuit 518 changes the frequency and duty ratio of a clock signal in response to a control signal generated by the constant voltage circuit 516. The demodulator circuit 519 is a circuit which demodulates a received signal, and the modulator circuit 520 is a circuit which modulates data to be transmitted.

For example, the demodulator circuit 519 is formed with a low-pass filter and binarizes a received amplitude-modulated (ASK) signal based on its amplitude. In order to vary the amplitude of an amplitude-modulated (ASK) transmission signal and transmit the signal, the modulator circuit 520 changes the amplitude of a communication signal by changing a resonance point of the resonance circuit 514.

The clock controller 523 generates a control signal for changing the frequency and duty ratio of a clock signal in accordance with the power supply voltage or a consumption current of the central processing unit 525. The power supply voltage is monitored by the power management circuit 530.

A signal input to the RFCPU 511 from the antenna 528 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like.

The central processing unit 525 accesses the read-only memory 527, the random-access memory 526, and the control register 522 via the CPU interface 524. The CPU interface 524 functions to generate an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of arithmetic processing is conducted by a dedicated arithmetic circuit and the other part of the arithmetic processing is conducted by the central processing unit 525 using a program.

Next, display devices will be described with reference to FIGS. 14A and 14B and FIGS. 15A and 15B.

Figure 14A:
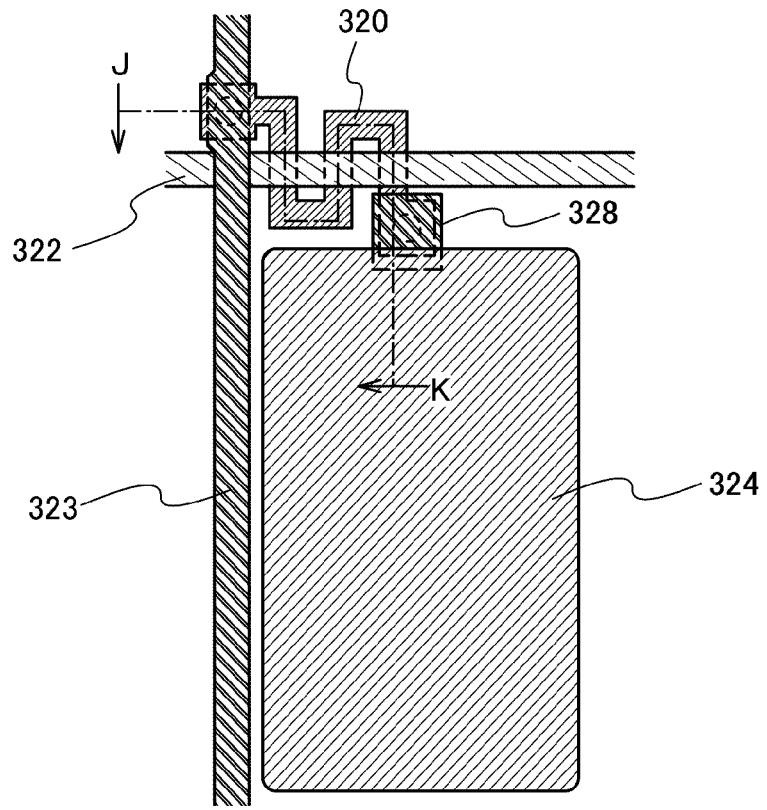
FIG. 14A is a plan view of a pixel of a liquid crystal display device.
Figure 14B:
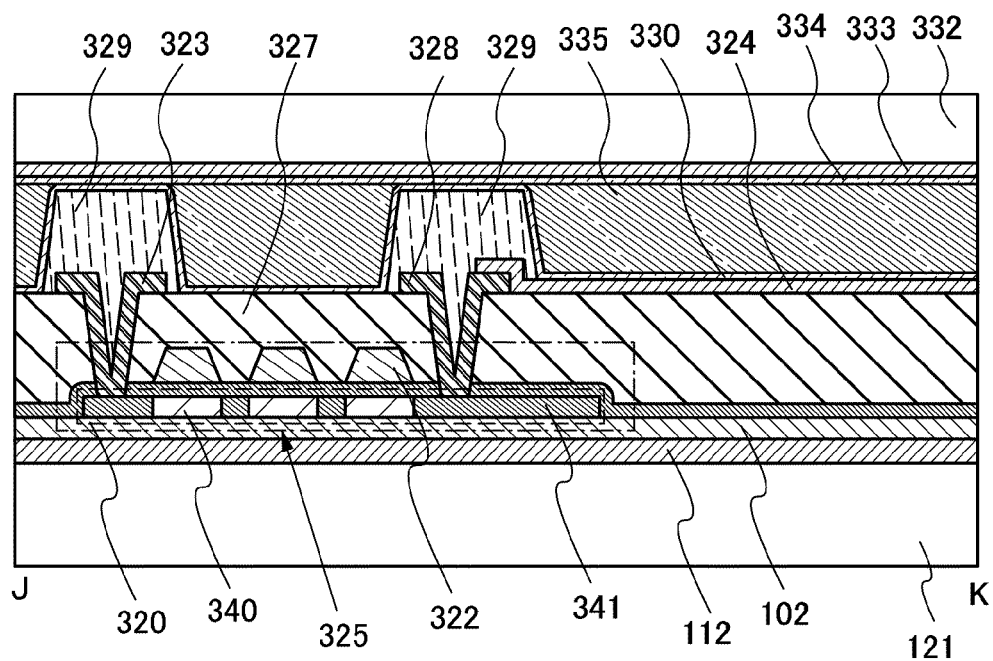
FIG. 14B is a cross-sectional view taken along line J-K of FIG. 14A.

FIGS. 14A and 14B are drawings for describing a liquid crystal display device. FIG. 14A is a plan view of a pixel of the liquid crystal display device, and FIG. 14B is a cross-sectional view taken along section line J-K of FIG. 14A.

As illustrated in FIG. 14A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer described in any of Embodiments 1 to 4 and is included in a TFT 325 of the pixel.

The semiconductor substrate described in any of Embodiments 1 to 4 is used. As illustrated in FIG. 14B, the single crystal semiconductor layer 320 is stacked over a base substrate 121 with an insulating layer 102 and an insulating layer 112 provided therebetween. As the base substrate 121, a glass substrate can be used. The single crystal semiconductor layer 320 of the TFT 325 is formed by element isolation of the single crystal semiconductor layer by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 that covers the counter electrode 333 are formed. The columnar spacers 329 are formed to maintain a space between the base substrate 121 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 15A:
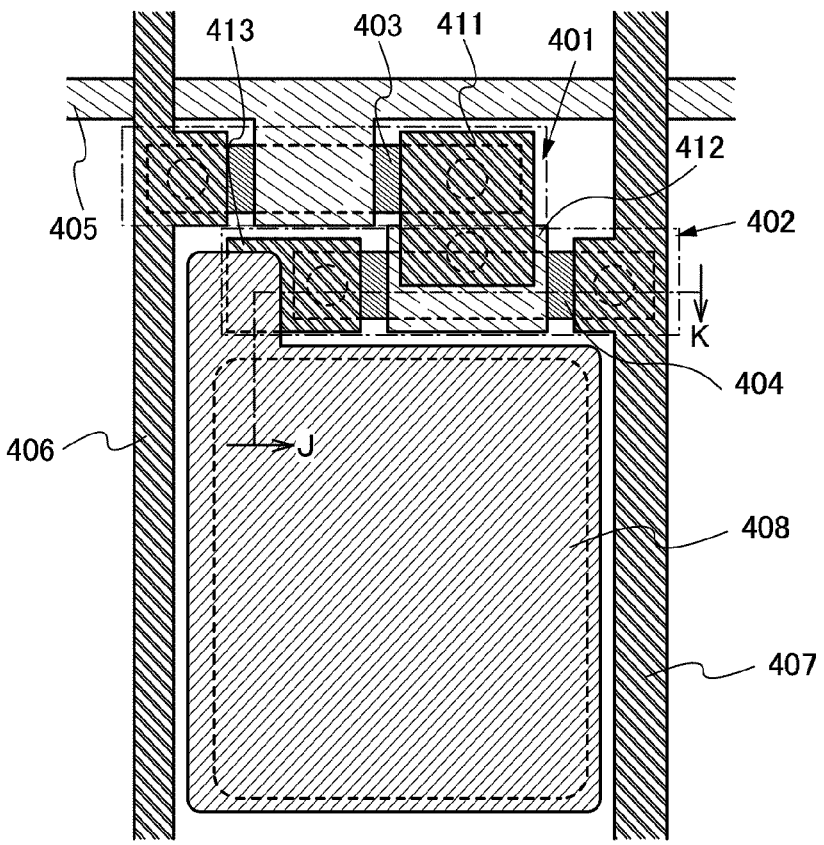
FIG. 15A is a plan view of a pixel of an electroluminescence display device.
Figure 15B:
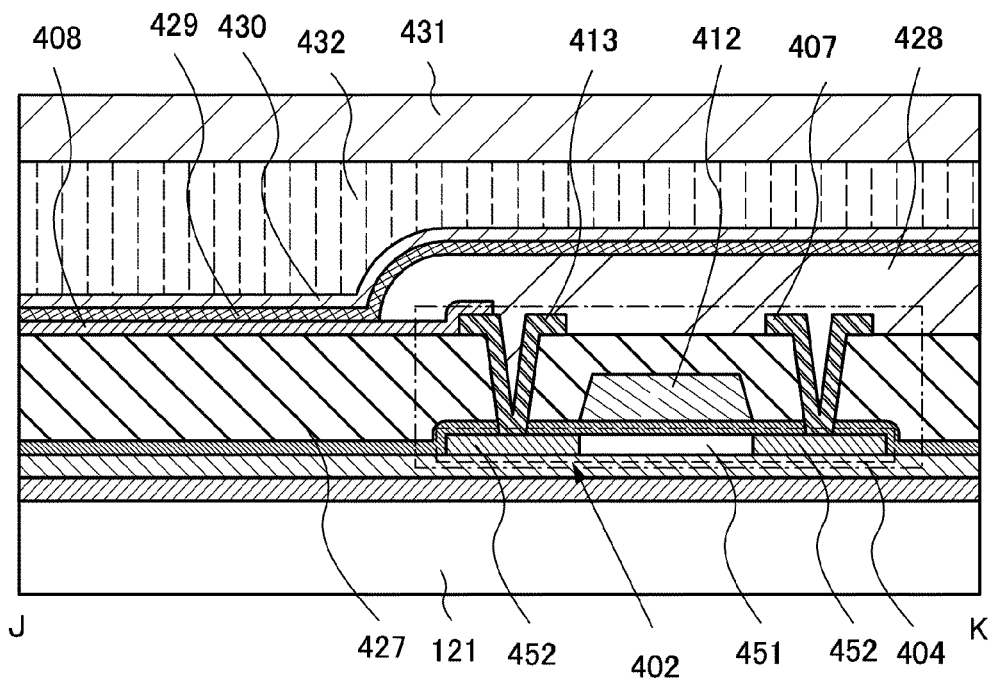
FIG. 15B is a cross-sectional view taken along line J-K of FIG. 15A.

Next, an electroluminescent display device (hereinafter referred to as an "EL display device") will be described with reference to FIGS. 15A and 15B. FIG. 15A is a plan view of a pixel of the EL display device, and FIG. 15B is a cross-sectional view taken along section line J-K of FIG. 15A.

As illustrated in FIG. 15A, the pixel includes a selecting transistor 401 and a display control transistor 402 that are TFTs, a scan line 405, a signal line 406, a current supply line 407, and a pixel electrode 408. Each pixel is provided with a light-emitting element having a structure in which a layer containing an electroluminescent material (EL layer) is interposed between a pair of electrodes. One of the electrodes of the light-emitting element is the pixel electrode 408. In a single crystal semiconductor layer 403, a channel formation region, a source region, and a drain region of the selecting transistor 401 are formed. In a single crystal semiconductor layer 404, a channel formation region, a source region, and a drain region of the display control transistor 402 are formed. The single crystal semiconductor layers 403 and 404 are formed of the single crystal semiconductor layer that is provided over the base substrate.

In the selecting transistor 401, a gate electrode is included in the scan line 405; one of a source electrode and a drain electrode is included in the signal line 406; and the other is formed as an electrode 411. In the display control transistor 402, a gate electrode 412 is electrically connected to the electrode 411; one of a source electrode and a drain electrode is formed as an electrode 413 that is electrically connected to the pixel electrode 408; and the other is included in the current supply line 407.

The display control transistor 402 is a p-channel TFT. As illustrated in FIG. 15B, in the single crystal semiconductor layer 404, a channel formation region 451 and p-type high-concentration impurity regions 452 are formed. Note that, as the semiconductor substrate used in this embodiment, the semiconductor substrate manufactured in any of Embodiments 1 to 4 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429.

A counter substrate 431 is provided as a reinforcing plate, and the counter substrate 431 is fixed to the base substrate 121 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. When the EL display device is manufactured by a manufacturing method including a manufacturing process of a semiconductor substrate according to any of Embodiments 1 to 4, the selecting transistor 401 and the display control transistor 402 do not have variation in electrical characteristics from pixel to pixel. Accordingly, the current drive method can be employed.

That is, various electronic devices can be manufactured by using semiconductor substrates according to any of Embodiments 1 to 4. Examples of electronic devices include cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices that are each capable of reproducing audio data stored in a recording medium such as a digital versatile disc (DVD) and that each have a display device capable of displaying image data stored therein); and the like. An example of them is illustrated in FIGS. 16A to 16F and FIGS. 17A to 17C.

Figure 16A:
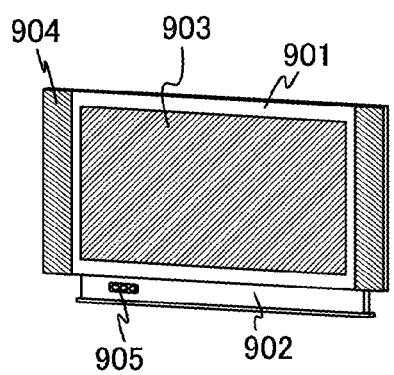
FIGS. 16A to 16F are diagrams each illustrating an electronic device according to one embodiment of the present invention.

FIG. 16A illustrates a display device, which includes a chassis 901, a support 902, a display portion 903, speakers 904, video input terminals 905, and the like. This display device is manufactured using the transistors formed by the manufacturing method described in another embodiment for a driver IC, the display portion 903, and the like. Note that the display device refers to a liquid crystal display device, a light-emitting display device, and the like, and all the information display devices for, for example, computers, television reception, and advertisement display can be included. Specifically, a display, a head-mounted display, a reflection type projector, and the like can be given.

Figure 16B:
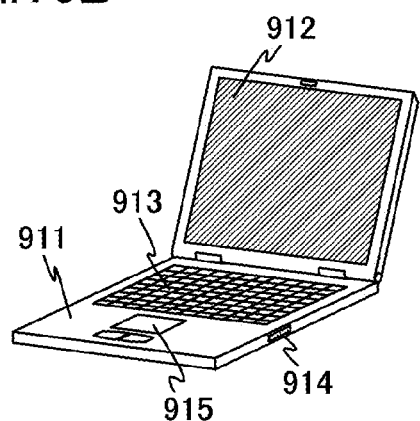

FIG. 16B illustrates a computer, which includes a chassis 911, a display portion 912, a keyboard 913, an external connection port 914, a pointing device 915, and the like. The transistors according to any of Embodiments 1 to 4 can be applied not only to a pixel portion in the display portion 912 but also to a semiconductor device such as a driver IC for display, a CPU inside a main body, or a memory.

Figure 16C:
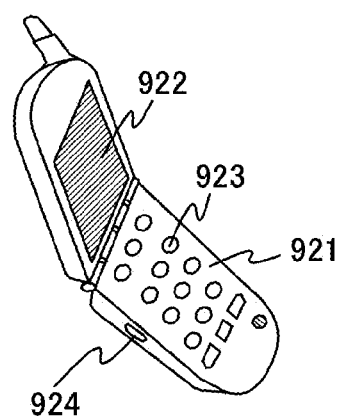

FIG. 16C illustrates a cellular phone, which is a typical example of a portable information processing terminals. This cellular phone includes a chassis 921, a display portion 922, operation keys 923, and the like. The transistors manufactured with use of the semiconductor substrate according to any of Embodiments 1 to 4 can be applied not only to a pixel portion in the display portion 922 or a sensor portion 924, but also to a driver IC for display, a memory, an audio processing circuit, and the like. The sensor portion 924 includes an optical sensor element, by which the luminance of the display portion 922 is controlled based on the luminance obtained by the sensor portion 924, and the brightness of the operation keys 923 is controlled based on the luminance obtained by the sensor portion 924. Thus, the power consumption of the cellular phone can be suppressed.

The semiconductor substrate according to any of Embodiments 1 to 4 can also be used for electronic devices such as a PDA (a personal digital assistant or a portable information processing terminal), a digital camera, a small game machine, a portable sound reproduction device, in addition to the above cellular phone. For example, the semiconductor substrate can be used for forming a functional circuit such as a CPU, a memory, or a sensor or for a pixel portion or a driver IC for display of those electronic devices.

Figure 16D:
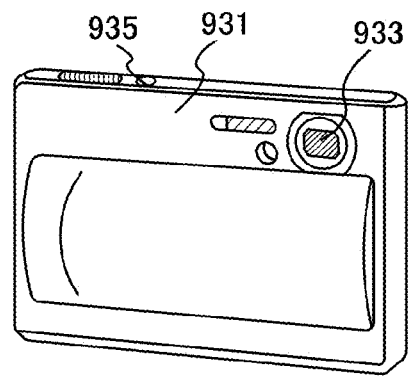
Figure 16E:
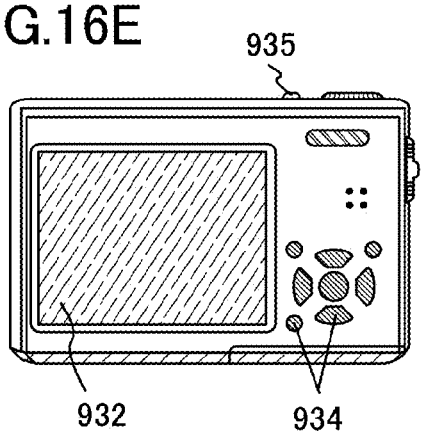

FIGS. 16D and 16E illustrate a digital camera. Note that FIG. 16E illustrates a rear side of the digital camera illustrated in FIG. 16D. This digital camera includes a chassis 931, a display portion 932, a lens 933, operation keys 934, a shutter button 935, and the like. The transistors according to any of Embodiments 1 to 4 can be used for a pixel portion of the display portion 932, a driver IC for driving the display portion 932, a memory, and the like.

Figure 16F:
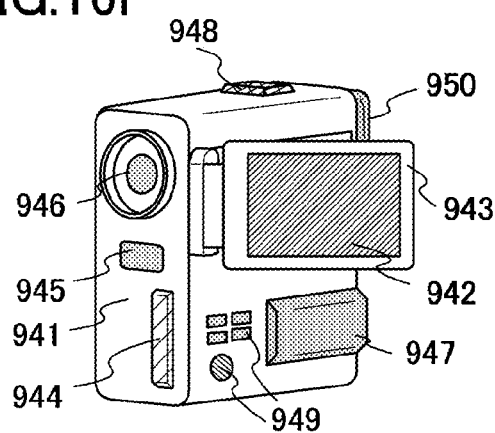

FIG. 16F illustrates a digital video camera. This digital video camera includes a main body 941, a display portion 942, a chassis 943, an external connection port 944, a remote control receiving portion 945, an image receiving portion 946, a battery 947, an audio input portion 948, operation keys 949, an eye piece portion 950, and the like. The transistors according to any of Embodiments 1 to 4 can be used for a pixel portion of the display portion 942, a driver IC for driving the display portion 942, a memory, a digital input processor, and the like.

Besides, the transistors according to any of Embodiments 1 to 4 can be applied to a navigation system, a sound reproduction device, an image reproduction device provided with a recording medium, and the like. The transistors according to any of embodiments 1 to 4 can be applied to pixel portions of display portions of these devices, driver ICs for controlling the display portions, memories, digital input processors, sensor portions, and the like.

Figure 17A:
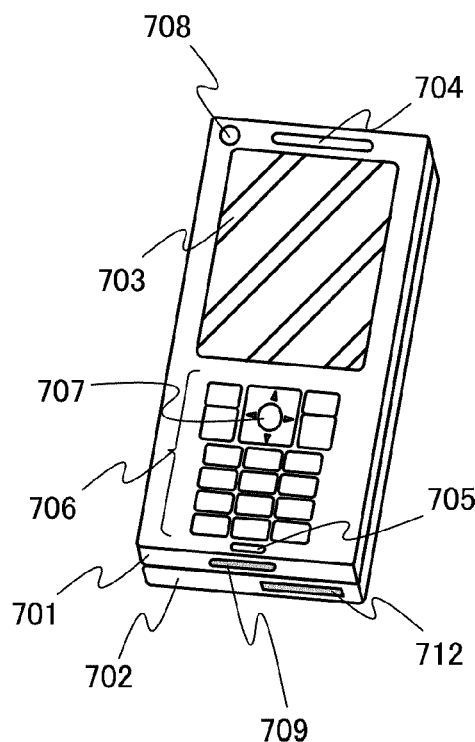
FIGS. 17A to 17C are diagrams illustrating an electronic device according to one embodiment of the present invention.
Figure 17B:
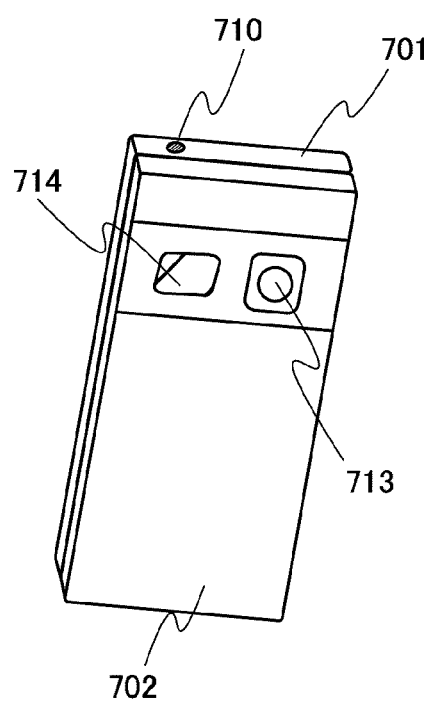
Figure 17C:
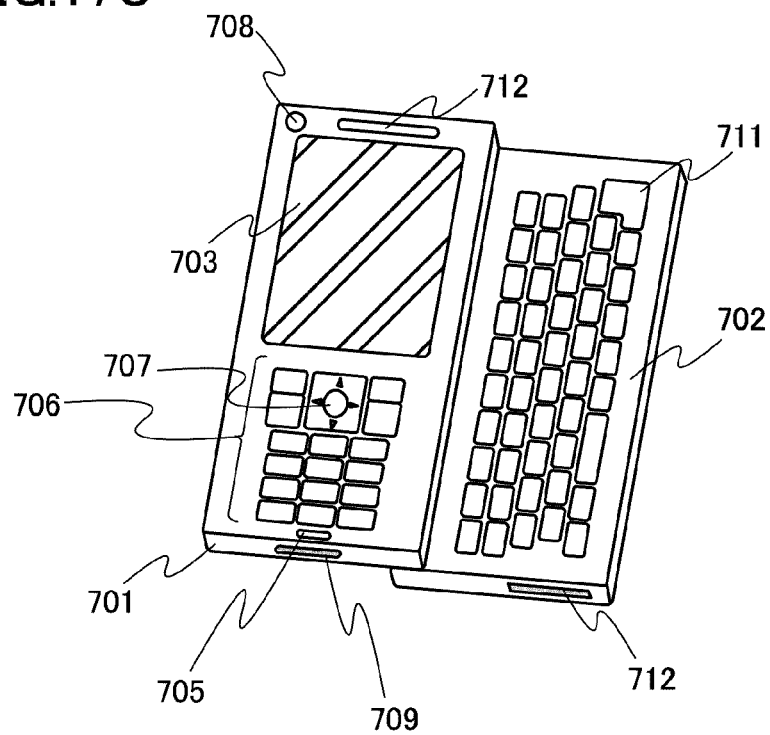

FIGS. 17A to 17C illustrate an example of a cellular phone to which one embodiment of the present invention is applied. FIG. 17A is a front view; FIG. 17B, a rear view; and FIG. 17C, a front view in which two chassis are slid. A cellular phone illustrated in FIGS. 17A to 17C includes two chassis 701 and 702. The cellular phone illustrated in FIGS. 17A to 17C is a so-called smartphone which has both functions of a cellular phone and a portable information terminal, and incorporates a computer and can process a variety of data processing in addition to voice calls.

The cellular phone illustrated in FIGS. 17A to 17C has the chassis 701 and 702. The chassis 701 includes a display portion 703, a speaker 704, a microphone 705, operation keys 706, a pointing device 707, a front-face camera lens 708, an external connection terminal jack 709, an earphone terminal 710, and the like. The chassis 702 includes a keyboard 711, an external memory slot 712, a rear-face camera 713, a light 714, and the like. In addition, an antenna is incorporated in the chassis 701.

Further, in addition to the above components, the cellular phone illustrated in FIGS. 17A to 17C may incorporate a contactless IC chip, a small size memory device, or the like.

The chassis 701 and 702 which are put together to be lapped with each other (illustrated in FIG. 17A) can be developed by sliding as illustrated in FIG. 17C. The display portion 703 can incorporate the display device illustrated in FIGS. 14A and 14B or FIGS. 15A and 15B. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone illustrated in FIGS. 17A to 17C can be used as a sound recording device (recorder) or a sound reproduction device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. The chassis 701 and 702 which are put together to be lapped with each other (FIG. 17A) can be developed by sliding as illustrated in FIG. 17C. When the cellular phone is used as a portable information terminal, smooth cursor operation can be conducted using the keyboard 711 or the pointing device 707. The external connection terminal jack 709 can be connected to an AC adaptor and various types of cables such as a USB cable, and charging and data communication with a personal computer or the like are possible. Moreover, a recording medium can be inserted into the external memory slot 712 so that a large volume of data can be stored and moved.

The chassis 702 is provided with the rear-face camera 713 and the light 714 on the rear face (FIG. 17B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic device illustrated in FIGS. 17A to 17C can be manufactured by application of the aforementioned method for manufacturing a transistor and a display device.

This application is based on Japanese Patent Application serial no. 2009-090471 filed with Japan Patent Office on Apr. 2, 2009, the entire contents of which are hereby incorporated by reference.

What is claimed is:

1. A method for manufacturing a semiconductor device, comprising the steps of:
    forming an island-shaped single crystal semiconductor layer whose top surface has a plane within ±10° from a {211} plane on an insulating surface over a base substrate;
    forming a non-single-crystal semiconductor layer in contact with the top surface and a side surface of the island-shaped single crystal semiconductor layer and on the insulating surface;
    irradiating the non-single-crystal semiconductor layer with laser light to melt the non-single-crystal semiconductor layer, and to crystallize the non-single-crystal semiconductor layer formed on the insulating surface with use of the island-shaped single crystal semiconductor layer as a seed crystal, so that a crystalline semiconductor layer is formed; and
    forming an n-channel transistor and a p-channel transistor with use of the crystalline semiconductor layer.

2. A method for manufacturing a semiconductor device, comprising the steps of:
    forming an island-shaped single crystal semiconductor layer whose top surface has a plane within ±10° from a {211} plane on an insulating surface over a base substrate;

forming an insulating layer so as to cover the top surface and a side surface of the island-shaped single crystal semiconductor layer and to be on the insulating surface;

forming an opening in the insulating layer to expose the top surface of the island-shaped single crystal semiconductor layer;

forming a non-single-crystal semiconductor layer so as to cover the exposed top surface of the island-shaped single crystal semiconductor layer and the insulating surface;

irradiating the non-single-crystal semiconductor layer with laser light to melt the non-single-crystal semiconductor layer, and to crystallize the non-single-crystal semiconductor layer formed on the insulating surface with use of the island-shaped single crystal semiconductor layer as a seed crystal, so that a crystalline semiconductor layer is formed; and forming an n-channel transistor and a p-channel transistor with use of the crystalline semiconductor layer.

3. The method for manufacturing a semiconductor device, according to claim 1 or 2, wherein the step of forming the island-shaped single crystal semiconductor layer whose top surface has the plane within ±10° from the {211} plane on the insulating surface comprises the steps of:

adding an ion to a single crystal semiconductor substrate whose top surface has a plane within ±10° from a {211} plane to form an embrittled region;

bonding the single crystal semiconductor substrate and the base substrate having the insulating surface; and splitting the single crystal semiconductor substrate along the embrittled region.

4. The method for manufacturing a semiconductor device, according to claim 1 or 2, wherein a channel length direction of the n-channel transistor and a channel length direction of the p-channel transistor are in a <111>direction.

5. The method for manufacturing a semiconductor device, according to claim 1 or 2, wherein a CMOS circuit is formed with use of the n-channel transistor and the p-channel transistor.

6. The method for manufacturing a semiconductor device, according to claim 1 or 2, wherein a single crystal silicon layer is formed as the island-shaped single crystal semiconductor layer.

7. A method for manufacturing a semiconductor device, comprising the steps of:

forming a non-single-crystal semiconductor layer on an insulating surface over a base substrate;

forming an island-shaped single crystal semiconductor layer whose top surface has a plane within ±10° from a {211} plane on the non-single-crystal semiconductor layer;

irradiating the non-single-crystal semiconductor layer with laser light to melt the non-single-crystal semiconductor layer, and to crystallize the non-single-crystal semiconductor layer with use of the island-shaped single crystal semiconductor layer as a seed crystal, so that a crystalline semiconductor layer is formed; and forming an n-channel transistor and a p-channel transistor with use of the crystalline semiconductor layer, wherein the step of forming the island-shaped single crystal semiconductor layer whose top surface has the plane within ±10° from the {211} plane on the non-single-crystal semiconductor layer comprises the steps of:

adding an ion to a single crystal semiconductor substrate whose top surface has a plane within ±10° from a {211} plane to form an embrittled region;

bonding the single crystal semiconductor substrate and the base substrate including the non-single-crystal semiconductor layer; and splitting the single crystal semiconductor substrate along the embrittled region.

8. The method for manufacturing a semiconductor device, according to claim 7, wherein a channel length direction of the n-channel transistor and a channel length direction of the p-channel transistor are in a <111>direction.

9. The method for manufacturing a semiconductor device, according to claim 7, wherein a CMOS circuit is formed with use of the n-channel transistor and the p-channel transistor.

10. The method for manufacturing a semiconductor device, according to claim 7, wherein a single crystal silicon layer is formed as the island-shaped single crystal semiconductor layer.

11. The method for manufacturing a semiconductor device, according to claim 1, 2 or 7, further comprising the steps of:

dividing a single crystal semiconductor substrate whose top surface has a plane within ±10° from a {211} plane to form a plurality of single crystal semiconductor substrates;

adding an ion to the plurality of single crystal semiconductor substrates whose top surfaces each have the plane within ±10° from the {211} plane to form a plurality of embrittled regions;

bonding the plurality of single crystal semiconductor substrates and the base substrate; and splitting the plurality of single crystal semiconductor substrates along the plurality of embrittled regions, thereby, forming a plurality of the island-shaped single crystal semiconductor layers.

12. The method for manufacturing a semiconductor device, according to claim 1, 2 or 7, further comprising the steps of:

adding an ion to a single crystal semiconductor substrate whose top surface has a plane within ±10° from a {211} plane to form an embrittled region;

selectively etching the single crystal semiconductor substrate to form a plurality of projection portions and a plurality of recessed portions on the single crystal semiconductor substrate;

bonding the plurality of projection portions and the base substrate; and splitting the plurality of projection portions along the embrittled region thereby, forming a plurality of the island-shaped single crystal semiconductor layers.

* * * * *